United States Patent
Fukunishi et al.

(10) Patent No.: US 7,598,491 B2
(45) Date of Patent: Oct. 6, 2009

(54) OBSERVING METHOD AND ITS APPARATUS USING ELECTRON MICROSCOPE

(75) Inventors: Munenori Fukunishi, Yokohama (JP); Toshifumi Honda, Yokohama (JP); Yuuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 366 days.

(21) Appl. No.: 11/415,286

(22) Filed: May 2, 2006

(65) Prior Publication Data

US 2006/0289752 A1     Dec. 28, 2006

(30) Foreign Application Priority Data

May 9, 2005    (JP)   ............... 2005-135589

(51) Int. Cl.
    *G21K 7/00*     (2006.01)
    *G01N 23/225*     (2006.01)

(52) U.S. Cl. ............... 250/310; 250/311; 250/492.1

(58) Field of Classification Search ............... 250/310, 250/307, 311, 492.2, 492.3; 356/72, 369
See application file for complete search history.

(56) References Cited

U.S. PATENT DOCUMENTS

| | | | |
|---|---|---|---|
| 4,420,686 A * | 12/1983 | Onoguchi et al. ........... | 250/310 |
| 4,851,768 A * | 7/1989 | Yoshizawa et al. ........... | 324/751 |
| 6,031,614 A * | 2/2000 | Michaelis et al. ........... | 356/369 |
| 6,329,826 B1 * | 12/2001 | Shinada et al. ............... | 324/751 |
| 6,812,462 B1 * | 11/2004 | Toth et al. .................... | 250/310 |
| 7,196,782 B2 * | 3/2007 | Fielden et al. ................ | 356/72 |
| 2002/0102749 A1* | 8/2002 | Fielden et al. ................ | 438/14 |
| 2004/0235205 A1* | 11/2004 | Levy et al. .................... | 438/14 |

FOREIGN PATENT DOCUMENTS

| | | |
|---|---|---|
| JP | 2000-021345 | 1/2000 |
| JP | 2004-219343 | 8/2004 |

* cited by examiner

*Primary Examiner*—Nikita Wells
*Assistant Examiner*—Johnnie L Smith
(74) *Attorney, Agent, or Firm*—Antonelli, Terry, Stout & Kraus, LLP.

(57) ABSTRACT

The present invention relates to high-speed acquisition of both a perpendicular observation image and a tilt observation image, in observation using a scanning electron microscope. An electron-beam observation apparatus includes: a first electro-optical system which scans a converged electron beam from a substantially perpendicular direction to a defect on a target wafer to be observed, and acquires a defect image signal with perpendicular observation by detecting a secondary electron image or a reflected electron image generated from the defect; and a second electro-optical system which scans a converged electron beam from a tilt direction to the defect, and acquires a defect image signal with tilt observation by detecting a secondary electron image or a reflected electron image generated from the defect.

15 Claims, 16 Drawing Sheets

OBSERVING METHOD AND ITS APPARATUS USING ELECTRON MICROSCOPE

BACKGROUND OF THE INVENTION

The present invention relates to an observing method and its apparatus, using a scanning electron microscope, for reviewing a defect that occurs on a surface of a semiconductor electronic circuit substrate, a liquid crystal display substrate or other substrates.

In a manufacturing process of a large scale integrated circuit including a semiconductor electronic circuit substrate and a liquid crystal display substrate, in order to achieve an early increase in yield and stable operation of the manufacturing process, it is important to grasp situation of how a defect has generated by using an inline wafer inspection system, and to analyze the defect in detail by an analyzer, and thereby to take quick and appropriate measures for the manufacturing process on the basis of knowledge concerning cause of the defect generation acquired from the above. An inline wafer inspection apparatus outputs coordinates of the defect; and the analyzer acquires (collects) a defect image on the basis of the defect coordinates. An engineer identifies the cause of the defect on the basis of the defect image. An example of the analyzer mentioned above includes a review SEM apparatus which acquires (collects) a high-definition image by use of a scanning electron microscope (SEM). The review SEM is characterized by having an automatic defect review (ADR) function of acquiring a defect image using defect coordinates, and an automatic defect classification (ADC) function of classifying the acquired image according to a kind of a defect. In recent years, with the progress of the miniaturization of semiconductor processes, the number of defects detected in inline wafer tends to increase. Therefore, the speedup of the ADR is becoming more and more important.

On the other hand, in order to analyze a defect in further detail, in addition to an image taken from just above (a perpendicular direction) a target to be observed (hereinafter this image is abbreviated as "perpendicular observation image"), performing tilt observation is also effective. As the tilt observation, Japanese Patent Laid-open Nos. 2000-21345 and 2004-219343 disclose stage tilt in which observation is made in an oblique direction by tilting a stage.

Further, as a tilt observation method, U.S. Pat. No. 6,812,462 describes a configuration in which two electro-optical systems, a dedicated electro-optical system for imaging a perpendicular observation image and a dedicated electro-optical system for performing tilt observation, are used in combination.

Since the stage tilt described in the Japanese Patent Laid-open Nos. 2000-21345 and 2004-219343 needs to tilt the hardware of a stage. Accordingly, if a perpendicular observation image and a tilt observation image are acquired on a defect basis, it is necessary to tilt the hardware on a defect basis. Therefore, the above tilt observation method is not suitable for ADR which requires acquisition of many images at high speed. Heretofore, high-speed acquisition of a tilt observation image concurrently with a perpendicular observation image during ADR was not sufficiently taken into consideration.

On the other hand, the configuration described in U.S. Pat. No. 6,812,462, which uses the two electro-optical systems in combination, has a problem in that imaging tilted in an arbitrary direction cannot be performed. Therefore, this configuration is not suitable for defect review in which it is important to take a tilt observation image from an arbitrary direction.

SUMMARY OF THE INVENTION

According to the present invention, an electron-beam observation apparatus (review SEM apparatus) capable of acquiring a perpendicular observation image and a tilt observation image at high speed during ADR, and its method, are provided.

To be more specific, according to one aspect of the present invention, there is provided an electron-beam observation apparatus (review SEM apparatus). This apparatus includes: a stage on which a to-be-observed target sample having a defect is placed, the stage moving at least in XY directions; a first electro-optical system which irradiates by scanning a converged electron beam from a substantially perpendicular direction to a defect on the target sample to be observed, and outputs a defect image signal with perpendicular observation by detecting a secondary electron image or a reflected electron image generated from the defect, by first electron detection means; and a second electro-optical system which irradiates by scanning a converged electron beam from a tilt direction to the defect on the target sample to be observed, and outputs a defect image signal with tilt observation by detecting a secondary electron image or a reflected electron image generated from the defect, by a second electron detection means; wherein the defect image signal with the perpendicular observation is acquired from the first electro-optical system, and the defect image signal with the tilt observation is acquired from the second electro-optical system.

According to another aspect of the present invention, there is provided an observing method using an electron-beam observation apparatus. This observing method includes the steps of: irradiating by scanning a converged electron beam from a substantially perpendicular direction to a defect on a target sample to be observed, the defect being detected by an inspection apparatus beforehand; detecting a secondary electron and/or a reflected electron which is generated from the defect on the target sample to be observed by irradiating the converged electron beam from the substantially perpendicular direction, by a first electron detection means; acquiring a defect image signal with perpendicular observation, from a signal detected the secondary electron and/or the reflected electron by the first electron detection means; irradiating by scanning a converged electron beam from a tilt direction to the defect on the target sample to be observed, the defect being detected by the inspection apparatus beforehand; detecting a secondary electron and/or a reflected electron which is generated from the defect on the target sample to be observed by irradiating the converged electron beam from the tilt direction, by a second electron detection means; acquiring a defect image signal with tilt observation, from a signal detected the secondary electron and/or the reflected electron by the second electron detection means; and displaying the defect image signal with the perpendicular observation and the defect image signal with the tilt observation on same screen.

According to still another aspect of the present invention, there is provided an observing method using an electron-beam observation apparatus. This observing method includes the steps of: acquiring a defect image of first magnification with perpendicular observation by scanning and irradiating a converged electron beam from a substantially perpendicular direction to a first area including a defect on a target sample to be observed, the defect being detected by an inspection apparatus beforehand, and by detecting a secondary electron and/ or a reflected electron which is generated from the first area; acquiring a defect image of second magnification being higher than the first magnification with the perpendicular observation by scanning and irradiating the converged electron beam from the substantially perpendicular direction to a second area including the defect, the second area being narrower than the first area, and by detecting a secondary electron and/or a reflected electron which is generated from the second area; acquiring a defect image of third magnification with tilt observation by scanning and irradiating a converged electron beam from tilt direction to a third area including the defect, and by detecting a secondary electron and/or a reflected electron which is generated from the third area; and displaying the defect image signal of the second magnification with the perpendicular observation and the defect image signal of the third magnification with the tilt observation, on same screen.

According to the present invention, it becomes possible to acquire not only a perpendicular observation image but also a tilt observation image at high speed during ADR, and consequently, information that provides a clue to identification of a cause of failure in a manufacturing process can be increased. This in turn makes it possible to shorten the time required to identify the cause of the failure. Moreover, according to the present invention, it becomes possible to analyze in detail a cause of process failure by use of a review SEM apparatus.

These and other objects, features and advantages of the invention will be apparent from the following more particular description of preferred embodiments of the invention, as illustrated in the accompanying drawings.

DESCRIPTION OF THE PREFERRED EMBODIMENTS

Preferred embodiments of a review system and a review SEM apparatus according to the present invention will be described with reference to drawings below.

First Embodiment

A first embodiment of the present invention relates to a review SEM apparatus for acquiring (reviewing) a review image of a defective part detected by a visual inspection apparatus, and is characterized by high-speed acquisition of a tilt observation image as well as a perpendicular observation image at the time of reviewing.

The first embodiment of a review system and a review SEM apparatus according to the present invention will be below described in the order of a configuration, an imaging sequence in ADR, and GUI.

Figure 1:
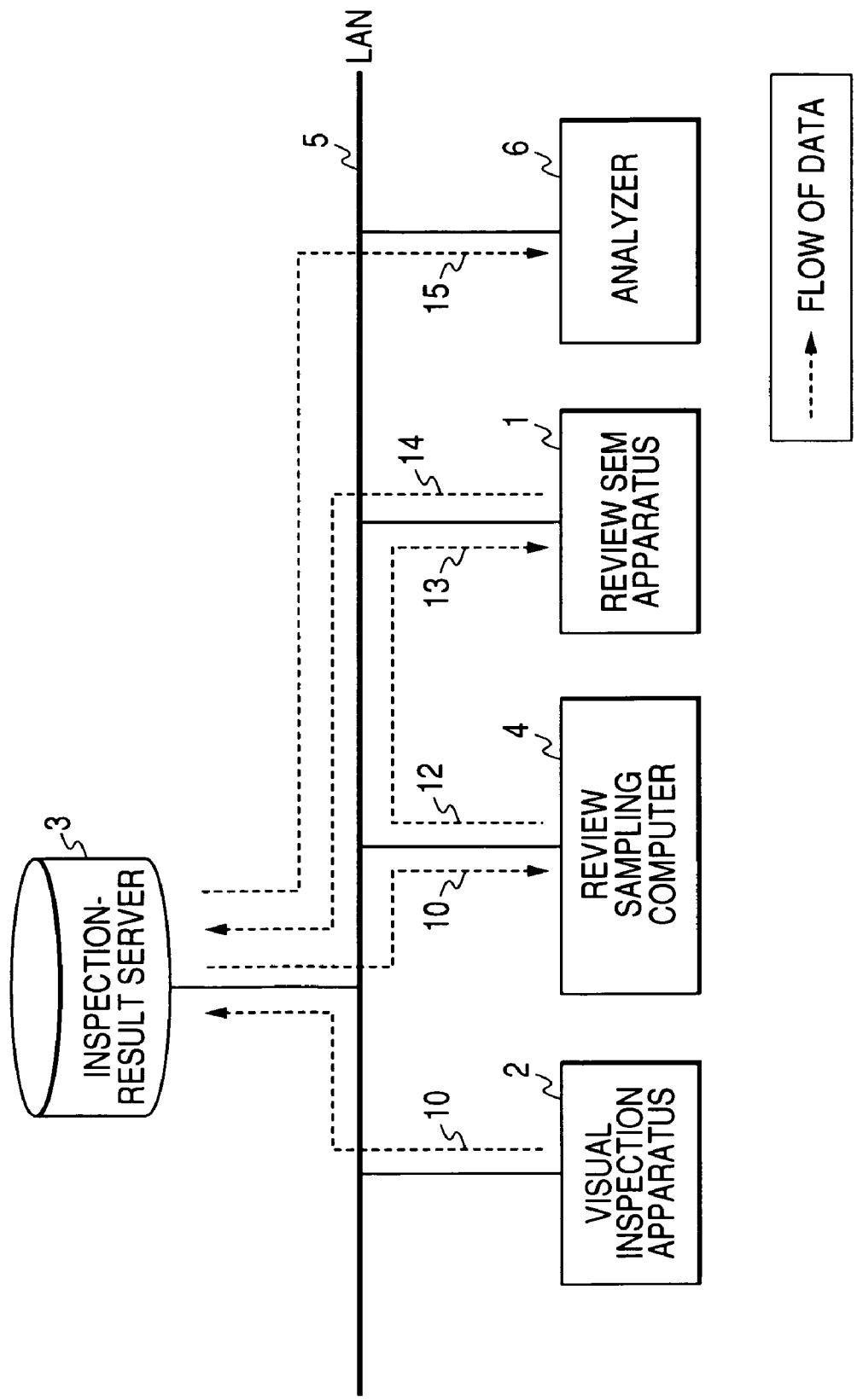
FIG. 1 is a diagram illustrating a configuration, and a role, of a review system.

First of all, a configuration and a role of the review system according to the first embodiment of the present invention will be described with reference to FIG. 1. The inspection result (including position coordinate information etc. about a defect on a target wafer (sample) to be observed) 10, which has been detected by a visual inspection apparatus 2, is accumulated in an inspection-result server 3 through a LAN 5. A review sampling computer 4 acquires the inspection result 10 accumulated in the inspection-result server 3, and then analyzes how defects are distributed; for example, the distribution of the defects includes the random distribution, the cluster distribution, and the linear distribution. After that, the review sampling computer 4 calculates (samples) defect candidates including defect of each of distribution categories without biasing to defect of a specific distribution category based on the analytical result of the distribution of the defects, and then transmits the review defect candidate 12 to the inspection-result server 3. The review SEM apparatus 1 performs positioning of a defective part on the basis of the inspection result and the review defect candidate 14, acquires an image of the defective part (automatic defect review (ADR)), and then transmits the review image and the result of the defect classification (the result of ADC) 14 to the inspection-result server 3. Paying attention to a defect to be analyzed in detail, which has been judged by an engineer, positioning of its defective part is performed on the basis of the inspection result and a review defect ID 15, before the defect in question is analyzed in more detail by an analyzer 6.

Figure 2:
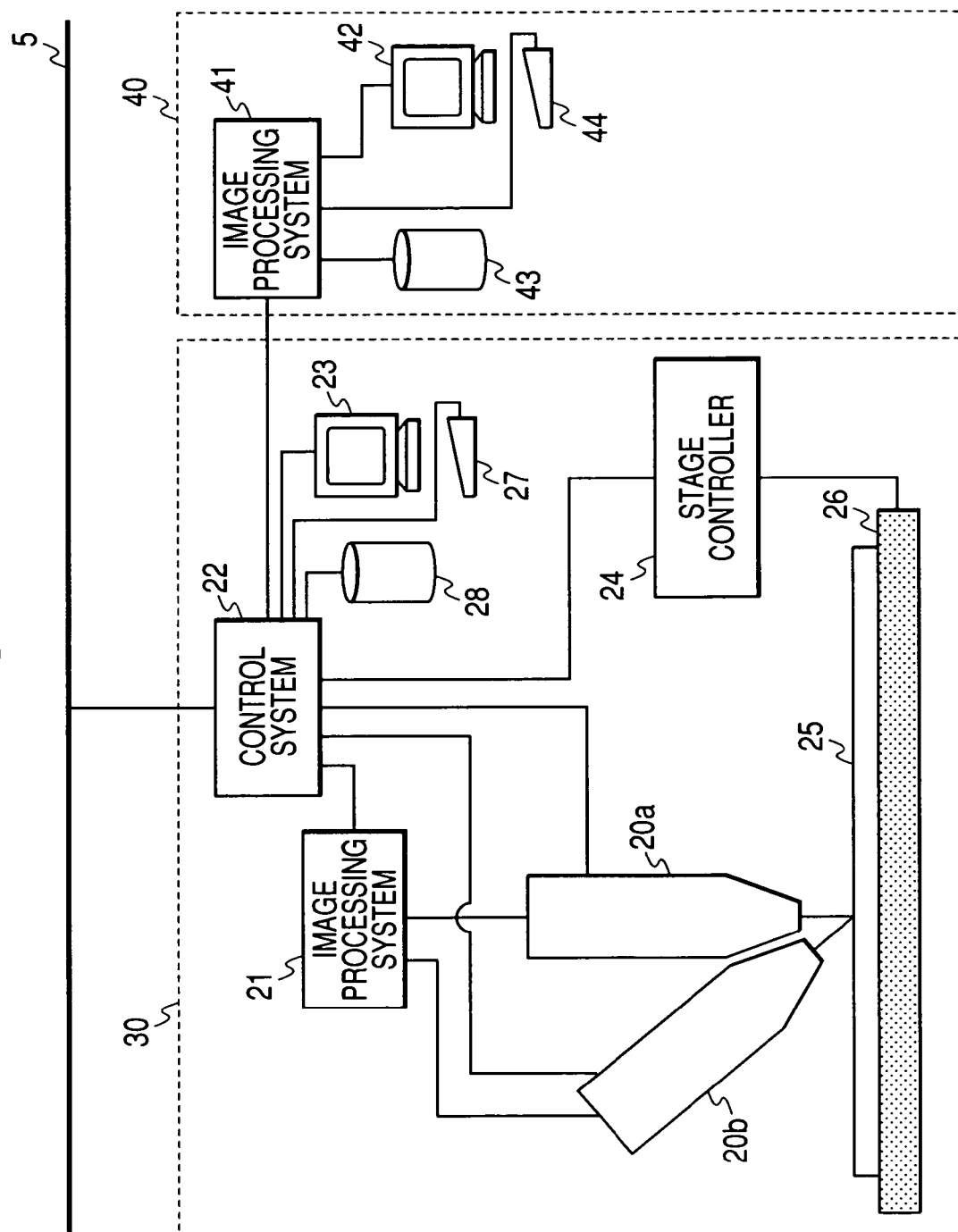
FIG. 2 is a diagram illustrating a configuration of a review SEM apparatus according to a first embodiment.

Next, a configuration of the review SEM apparatus 1 according to the first embodiment of the present invention will be described with reference to FIG. 2. The review SEM apparatus 1 comprises a defect-image acquisition unit 30 and a defect classification unit 40. First of all, the review SEM apparatus 1 is characterized by its configuration in which the defect-image acquisition unit 30 comprises two components, a first electro-optical system column (perpendicular column) 20a and a second electro-optical system column (tilted column) 20b, and they are located so as to each irradiate the target wafer to be observed 25 with an electron beam at the same position. The first electro-optical system column (perpendicular column) 20a is located in a downward direction substantially perpendicular to a surface of the target wafer to be observed 25 placed on a stage system 26. The second electro-optical system column (tilted column) 20b located in a direction that is oblique to the surface of the target wafer to be observed 25. Here, the perpendicular column 20a and the tilted column 20b are located so that both of them can irradiate the target wafer to be observed 25 with an electron beam at the same position. To be more specific, the perpendicular column 20a and the tilted column 20b are located so that an irradiation optical axis of the perpendicular column 20a and an irradiation optical axis of the tilted column 20b intersect each other on the surface of the target wafer to be observed 25. In this case, when the perpendicular column 20a and the tilted column 20b image the target wafer to be observed 25 at high magnification, an objective lens 55 is controlled so that a focused position of the perpendicular column 20a and a focused position of the tilted column 20b, for which a focus adjustment is made, become the above intersecting point (a position corresponding to the height of the surface of the target wafer to be observed).

The stage system 26 comprises a theta stage (rotatable stage), an X stage, and a Y stage. As a matter of course, the stage system 26 may include a Z stage.

A control system 22 is capable of controlling, for example, a beam current, an amount of XY deflection, and an amount of beam tilt, of an electron beam emitted from each of the electro-optic system columns 20a, 20b, and controlling the theta stage, X stage, and Y stage of the stage system 26 through a stage controller 24.

Each electronic image signal detected in the electro-optical system columns 20a, 20b is inputted into an image processing system 21 where the electronic image signal is analog-to-digital converted so as to generate image signals including a perpendicular observation image (secondary electron image), a perpendicular observation image (right shading image), a perpendicular observation image (left shading image); a tilt observation image (secondary electron image), a tilt observation image (right shading image), and a tilt observation image (left shading image). In addition, the image processing system 21 extracts a review defect image signal on the basis of the generated image signal, and then outputs the extracted review defect image signal to a GUI screen of a display 23 through the control system 22, and performs image processing of the extracted review defect image signal to calculate position coordinates, and the defect size, corresponding to a review defect ID. After that, the image processing system 21 provides the control system 22 with not only the review defect image signal but also the calculated position coordinates, and the defect size, corresponding to the review defect ID. The control system 22 stores the review defect image signal and the information in the storage device 28 included in the defect-image acquisition unit 30. Incidentally, reference numeral 27 denotes input means composed of a keyboard, a mouse and the like and connected to the control system 22.

As described above, the defect-image acquisition unit 30 is adapted to collect not only the review defect image signal but also the position coordinates, and the defect size, corresponding to the review defect ID, which can be acquired by performing the image processing on each electronic image signal detected by each of the electro-optical system columns 20a, 20b. In addition, the defect-image acquisition unit 30 stores the thus collected data in the storage device 28. Next, the defect-image acquisition unit 30 reads out, from the storage device 28, review defect information including the review defect image signal, and the position coordinates, and the defect size, corresponding to the review defect ID, and then transmits the review defect information to the defect classification unit 40.

On the other hand, on the basis of the review defect information (in particular, feature quantities of a review defect (the area, the XY projected length, and a maximum value, or an average value, of brightness value (gray scale value)) acquired from the review defect image signal), which review defect information has been provided from the defect-image acquisition unit 30, the defect classification unit 40 classifies the review defect according to its kind by use of, for example, the feature quantities space, and then displays the result of the classification on the display 42, and stores the result in the storage device 43, or in the storage device 28 included in the defect-image acquisition unit 30. Incidentally, reference numeral 44 denotes input means including a keyboard and a mouse.

The processing described above enables the review SEM apparatus 1 according to the present invention to acquire an image of the reviewed defective part (automatic defect review (ADR)), and transmit the review image and the result of the defect classification (ADC result) 14 to the inspection-result server 3.

Figure 3:
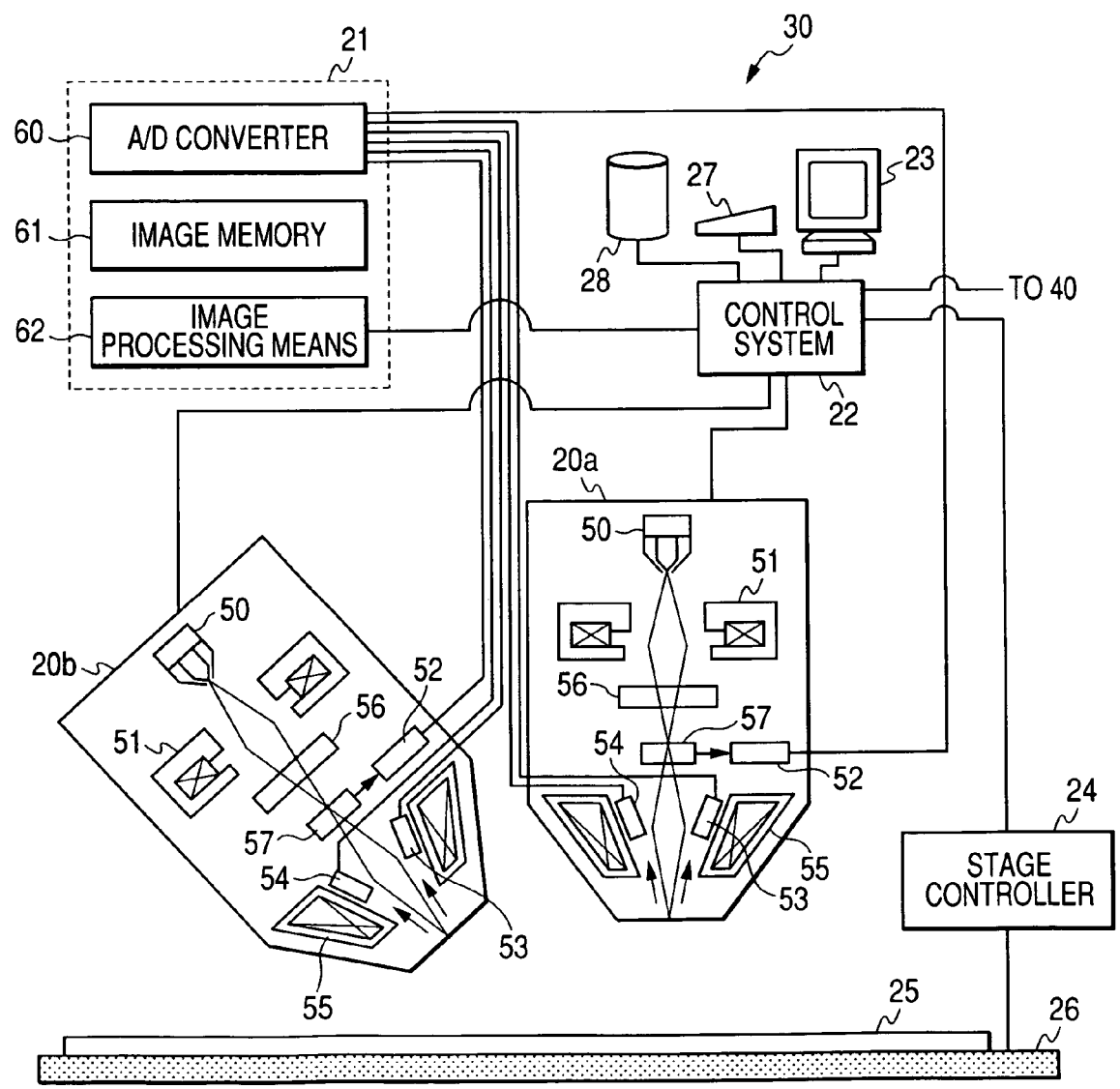
FIG. 3 is a diagram specifically illustrating a configuration of an electro-optical system column according to the first embodiment.

Next, how the electro-optical system column (perpendicular column) 20a and the electro-optical system column (tilted column) 20b are specifically configured will be described with reference to FIG. 3. In each of the perpendicular column 20a and the tilted column 20b, a condensing lens 51 reduces the expansion of a path of an electron beam emitted from an electron-beam irradiation means 50, and transfers the electron beam to a direction of the target wafer to be observed. The electron beam passing through a deflector 56 converges on the target wafer to be observed by an objective lens 55, that is, the target wafer to be observed 25 is irradiated with the electron beam. The deflector 56 is capable of controlling (beam-scanning) a beam irradiation position on the target wafer to be observed. With a stage system 26 being moved (traveled), and with the beam scanning being performed by each of the columns 20a, 20b in a direction orthogonal to the movement of the stage, a surface of the target wafer to be observed 25 is two-dimensionally irradiated with each electron beam. Thus, as a result of irradiating the surface of the target wafer with each electron beam, a secondary electron and a reflected electron are generated from the surface of the target wafer. The secondary electron that is output from the target wafer to be observed 25 in a direction of an irradiation optical axis of each of the columns 20a, 20b is inputted into a secondary electron detection means 52 with a path of the secondary electron being changed by each E×B deflector 57 provided in each irradiation optical axis. As a result, the secondary electron detection means 52 can detect the secondary electron generated by each of the perpendicular (fall) irradiation and the tilted irradiation, which secondary electron is output from the surface of the target wafer in a direction of each irradiation optical axis. On the other hand, each of a pair of reflected electrons, each of which is output from the target wafer to be observed 25 as a result of each of the perpendicular irradiation and the tilted irradiation, is detected by each of a pair of reflected electron detection means 53, 54 each being located in a direction forming a certain tilt angle with respect to each irradiation optical axis. Because shading (right shading and left shading made by the perpendicular irradiation, and right shading and left shading made by the tilted irradiation) of the surface of the target wafer to be observed can be expressed by each of the pair of reflected electrons, each of which forms the certain tilt angle with respect to each irradiation optical axis, this shading is detected. Detection signals (a perpendicular observation image (secondary electron image), a perpendicular observation image (right shading image), a perpendicular observation image (left shading image); a tilt observation image (secondary electron image), a tilt observation image (right shading image), a tilt observation image (left shading image)), which are output by each of the secondary electron detection means 52 and each of the pair of reflected electron detection means 53, 54, are converted into a digital image by an A/D converter 60 before the digital image is stored in an image memory 61. Image processing means 62 performs image processing on the basis of accumulated images. Each of the secondary electron images (the perpendicular observation image and the tilt observation image) is generated from a signal detected by each of the secondary electron detection means 52. The right shading image and the left shading image based on the perpendicular observation images and the right shading image and the left shading image based on the tilt observation images are generated from each of the reflected electron detection means 53, 54.

On the other hand, the control system 22 controls various kinds of conditions (a current value, a voltage value, and the like) of the electro-optical system including the electron-beam irradiation means 50, the condensing lens 51, the deflector 56, and the objective lens 55, which are located in each of the columns 20a, 20b, and also controls the movement of the stage 26 by use of a stage controller 24.

Incidentally, by controlling a magnetic field in the condensing lens 51 or a magnetic field in the deflector 56 or a magnetic field in the objective lens 55 in each of the columns 20a, 20b, it is possible to perform beam tilt that irradiates the surface of the target wafer to be observed 25 with a beam to a slanting (tilting) direction with respect to the irradiation optical axis.

Figure 4:
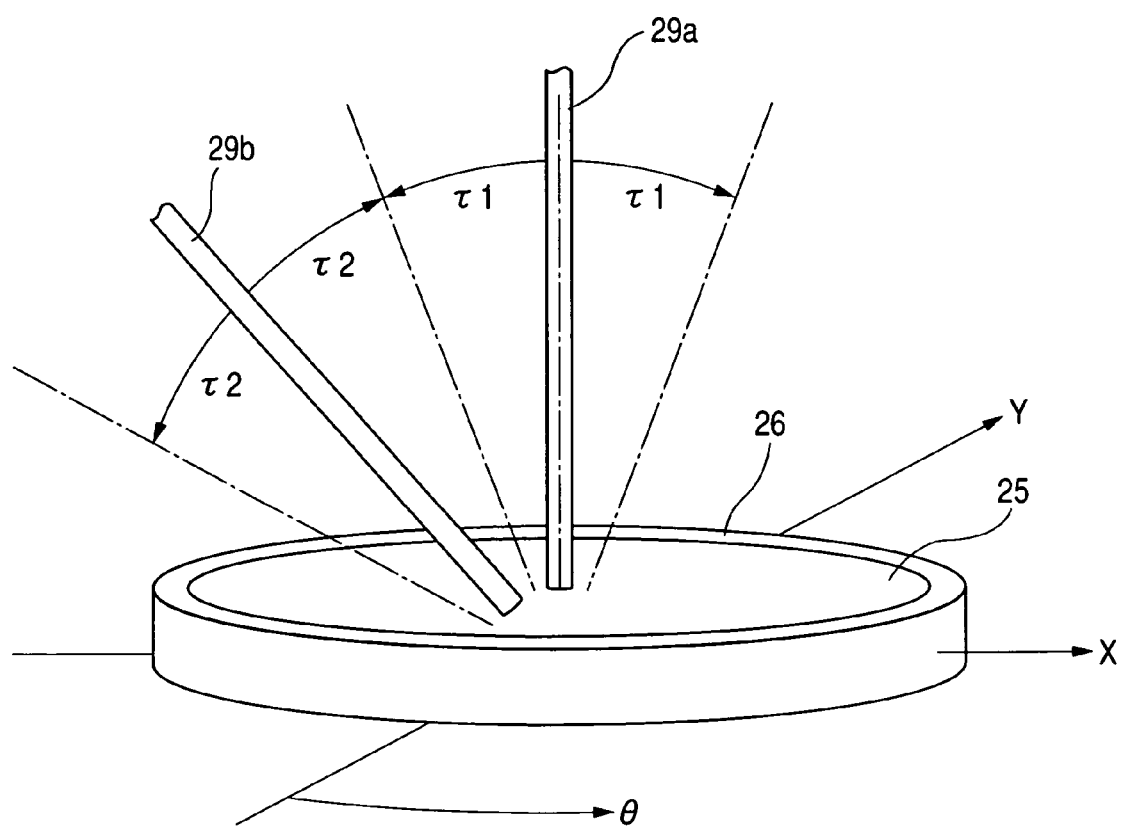
FIG. 4 is a diagram illustrating irradiation directions of electron beams emitted from a tilted column and a perpendicular column.

Next, how to observe a target wafer by use of the tilted column 20b and the perpendicular column 20a will be described with reference to FIG. 4. FIG. 4 is a diagram illustrating an irradiation direction of an electron beam emitted from the tilted column 20b and the perpendicular column 20a. The tilted column 20b and the perpendicular column 20a each have a beam tilt function of tilting a beam path for each of the electron beam 29a emitted from the perpendicular column 20a and the electron beam 29b emitted from the tilted column 20b by controlling the magnetic field in each column. Thus, it is difficult for the beam tilt in the column to largely change a beam path. However, a combination of the perpendicular column 20a with the tilted column 20b and provision of the beam tilt function in each of the columns make it possible to realize a tilt function of irradiating the surface of the target wafer to be observed 25 with a beam at an arbitrary tilt angle. In the configuration shown in FIG. 4, on the assumptions that the maximum value of a tilt angle of the electron beam 29a emitted from the perpendicular column 20a is $\tau 1$ (about 10 degrees), and the maximum value of a tilt angle of the electron beam 29b emitted from the tilted column 20b is $\tau 2$ (about 10 degrees), it is possible to make observations at an arbitrary tilt angle ranging from $(90-(\tau 1+2\times\tau 2))$ degrees to 90 degrees by setting an narrow angle formed between the perpendicular column 20a and the tilted column 20b at $\tau 1+\tau 2$ (or $(\tau 1+\tau 2)$ or less). For example, in a case of observing a semiconductor device, when a hole with a high aspect ratio is observed, if an electron beam is tilted at a large angle, a cross section of the hole cannot be observed. Therefore, it is desirable to observe the semiconductor device at a small tilt angle. On the other hand, if a cross-section of a wiring part is observed, it is desirable to observe the wiring part at a large angle. Therefore, the tilt observation may also be performed by the beam tilt that uses the perpendicular column 20a, or the tilted column 20b may also be used. Which method to use is determined by selecting a proper observation angle in response to a shape of a target to be observed, such as an aspect ratio. Since the beam tilt function used in the conventional single electro-optical system column has a small range of an angle at which an observation can be made by beam tilt, it is difficult to observe various kinds of targets whose aspect ratio largely changes. However, the tilt observation method according to the present invention can observe a tilt ranging from a small tilt angle to a large tilt angle. Therefore, it becomes possible to observe various kinds of targets whose aspect ratio largely changes.

A first modified example relating to the first embodiment of the above configuration of the columns is that beam tilt of only the electron beam 29a emitted from the perpendicular column 20a is performed, whereas beam tilt of the electron beam 29b emitted from the tilted column 20b is not performed. For example, in a case of observing a semiconductor device, when a hole with a high aspect ratio is observed, if a beam is tilted at a large angle, a cross-section of the hole cannot be observed. Therefore, it is desirable to observe the semiconductor device at a small tilt angle. On the other hand, if a cross-section of a wiring part is observed, it is desirable to observe the wiring part at a large angle. Therefore, according to the first modified example, when a hole with a high aspect ratio is observed, it becomes possible to observe the hole by beam tilting of the electron beam 29a emitted from the perpendicular column 20a. When a cross-section of the wiring part is observed, it becomes possible to observe the wiring part by emitting the electron beam 29b from the tilted column 20b so that an angle between the electron beam 29b and the surface of the target wafer to be observed is kept at a fixed angle (large angle) (for example, $\tau 1+\tau 2$). Incidentally, because an irradiation optical axis of the tilted column 20b is tilted relative to an irradiation optical axis of the perpendicular column 20a, in order to match the size of an incident-light image to that of a tilt observation image, it is necessary to correct a control signal sent to the deflector 56 of the tilted column 20b with reference to a control signal sent to the deflector 56 of the perpendicular column 20a.

A second modified example relating to the first embodiment of the column configuration described above is that beam tilt of only the electron beam 29b emitted from the tilted column 20b is performed, whereas beam tilt of the electron beam 29a emitted from the perpendicular column 20a is not performed. According to the second modified example, for example, in a case of observing a semiconductor device, when a hole with a high aspect ratio is observed, the semiconductor device is observed at a fixed angle in a perpendicularly downward direction. When a cross-section of the wiring part, a particle, and the like, are observed, it becomes possible to observe them from an arbitrary angle (for example, ranging from $\tau 1$ to $(\tau+2\times\tau 2)$).

Figure 5:
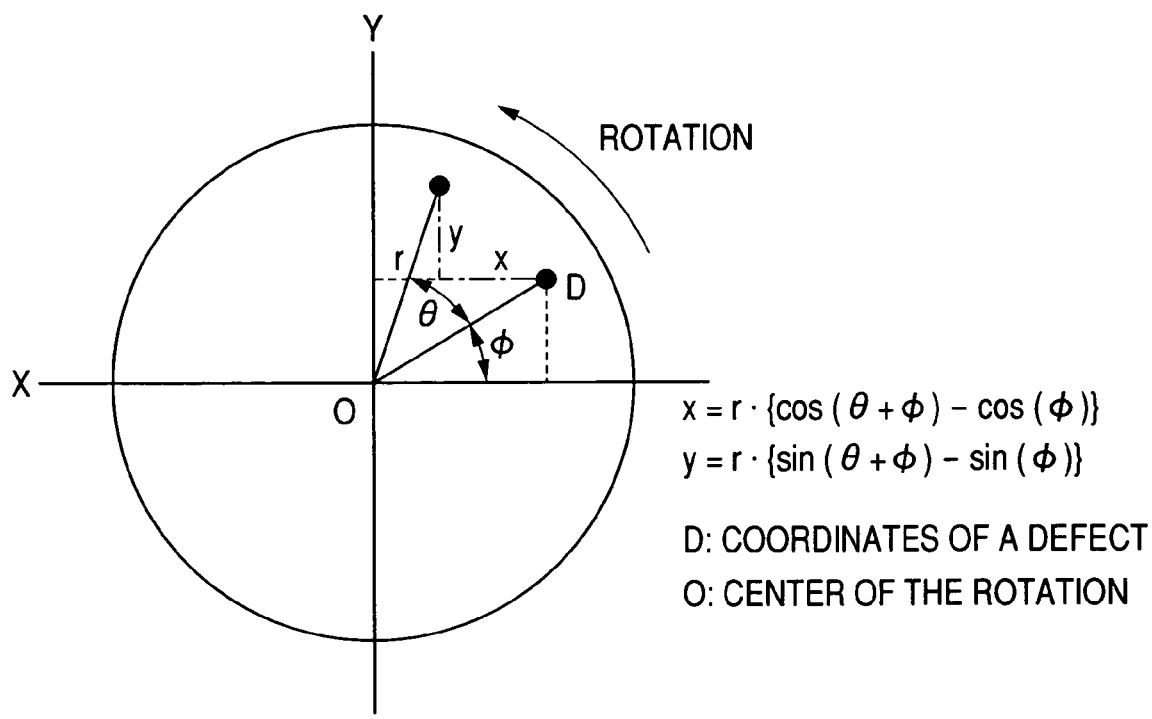
FIG. 5 is a diagram illustrating a correction method for correcting a deviation in visual field when a theta stage is rotated.

Incidentally, the stage system 26 has a rotation function not only in XY directions but also in a $\theta$ direction. The control system 22 exercises control in combination of the beam tilt function for the perpendicular column 20a and the tilted column 20b and rotation control for a rotatable stage in a $\theta$ direction (theta stage). This enables the image processing system 21 to observe the target wafer to be observed 25 from an arbitrary direction on the basis of image signals detected by the perpendicular column 20a and the tilted column 20b. However, when the theta stage is rotated in the $\theta$ direction to acquire an image, if a target to be observed (for example, a defect) does not coincide with the rotation center of the theta stage, there arises a problem in that the target to be observed disappears from a visual field. For this reason, the control system 22 makes a correction by moving the stage in the XY directions through the stage controller 24, or by performing beam shift (image (imaging visual field) shift) for the perpendicular column 20a and the tilted column 20b so that when the theta stage is rotated, a position of the target to be observed may always come to the center of the imaging visual field. This correction method will be described with reference to FIG. 5. On the assumptions that the rotation center O of a theta stage is a home position, and that coordinates of an observation position are polar coordinates (r,ϕΦ) (where r is the distance, ϕΦ is an angle), the amount of displacement calculated when the theta stage is rotated at an angle of θ can be expressed in an orthogonal coordinate system by equations (1) and (2).

$$x = rx\{\cos(\theta + \phi\Phi) - \cos(\phi\Phi)\} \quad (1)$$

$$y = rx\{\sin(\theta + \phi\Phi) - \sin(\phi\Phi)\} \quad (2)$$

In synchronization with the rotation of the theta stage in a rotation direction specified by input means 27 through the stage controller 24, the control system 22 successively corrects values calculated by the equations (1) (2) in the XY directions. As a result, the perpendicular column 20a and the tilted column 20b can make real-time observations of the target to be observed in an arbitrary direction without causing a deviation in visual field.

Figure 6:
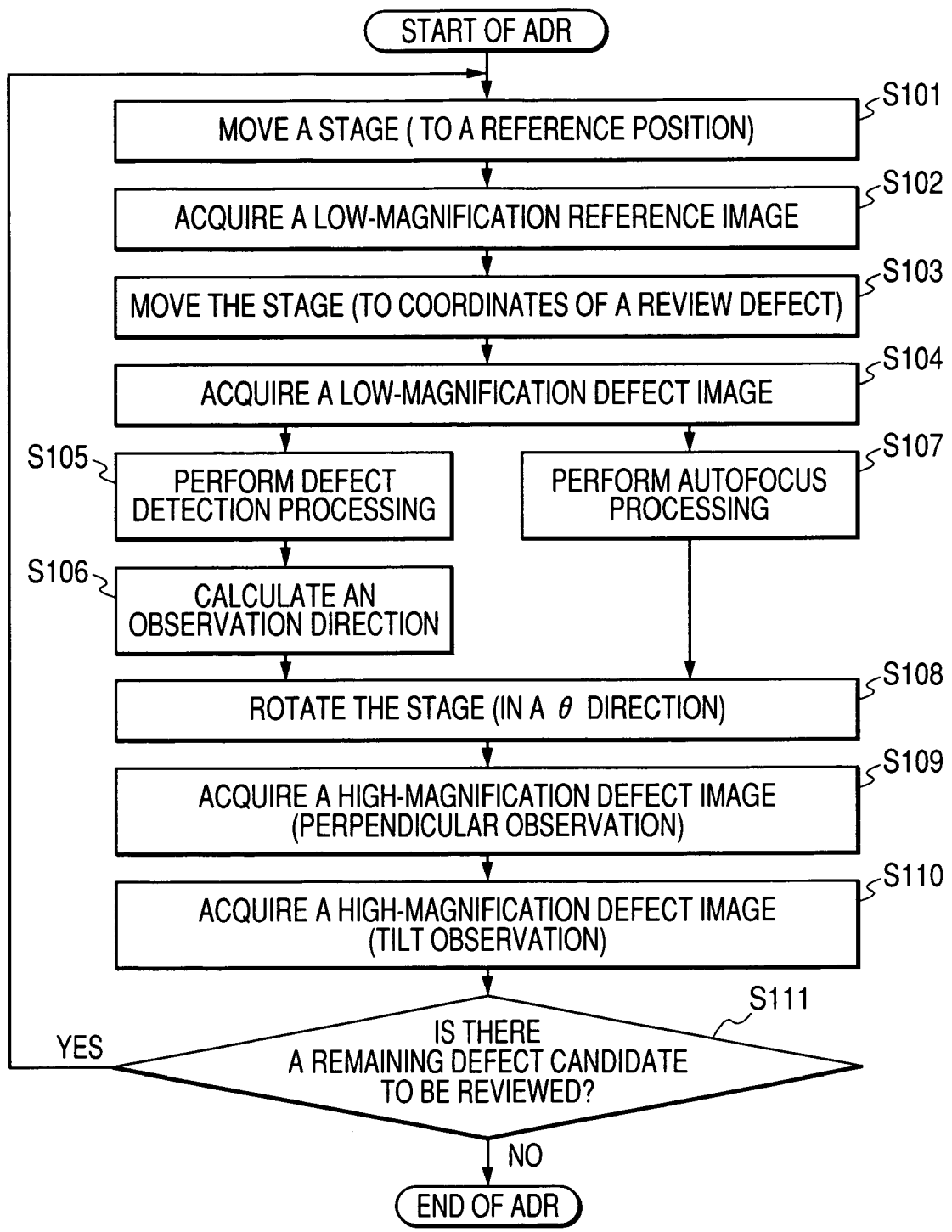
FIG. 6 is a diagram illustrating an automatic defect image acquisition sequence according to the first embodiment.

Next, a first embodiment of an automatic defect image acquisition (ADR) sequence which uses the review SEM apparatus 1 according to the present invention will be described with reference to FIG. 6. Incidentally, this ADR sequence relates to processing of, after carrying (loading) of the target wafer to be observed 25 into the review SEM apparatus 1, and setting of conditions of an electro-optical system, automatically acquiring (collecting) an image of a review defective part on the basis of the results of inspection (defect position information). Positioning of defect imaging is performed using the results of inspection (defect coordinates) in the ADR. However, because there is discrepancy in position caused by, for example, the stage precision of the visual inspection apparatus 2, and that of the review SEM apparatus 1, correction of defect coordinates is required to bring a defect into a visual field of imaging at high magnification.

A description will next be made of processing sequence of imaging a perpendicular observation image and a tilt observation image by use of the perpendicular column 20a and the tilted column 20b at high speed with defect coordinates being corrected. As soon as the ADR starts, on the basis of design data of the target wafer to be observed, and the like, the control system 22 controls the stage controller 24 so that the stage system 26 is moved to a reference position at which a pattern is thought to be the same as a review defective part (the review defective part is determined on the basis of the result of inspection performed by the visual inspection apparatus 2 (including position coordinate information about a defect on the target wafer to be observed) and a review defect candidate 14 sampled by the review sampling computer 4) (S101). Next, at the above reference position, the control system 22 controls the deflector 56 relative to, for example, the perpendicular column 20a, and thereby detects a low-magnification reference image whose magnification (about from 10,000 to 20,000) is lower than the observation magnification (about 100,000), by the secondary electron detector 52 or by the reflected electron detectors 53, 54, and then stores the low-magnification reference image in the image memory 61 of the image processing system 21 (S102). Next, the control system 22 controls the stage controller 24 so that the stage system 26 is moved to a position of the review defect (S103), and then, as is the case with the low-magnification reference image described above, acquires a low-magnification defect image of the review defect, and stores the low-magnification defect image in the image memory 61 of the image processing system 21 (S104). Next, by comparing the low-magnification reference image with the low-magnification defect image, both of which have been acquired and stored in the image memory 61 by the image processing means 62 of the image processing system 21, an area in which the difference is large is detected as a defect, and then a precise position (for example, a center-of-gravity position of the defect) of the detected defect is calculated, and the calculated precise position of the defect is given to the control system 22 (S105). Next, from a pattern direction at the precise defect position that has been calculated, the image processing means 62 of the image processing system 21 performs arithmetic operation of an observation direction (stage θ direction), and then provides the control system 22 with information about the observation direction (S106) (this processing will be detailed later). It is to be noted that the processing in step S106 may also be executed by the control system 22.

On the other hand, if imaging is performed at high magnification for observation, the depth of focus becomes shallow. Accordingly, in parallel with defect detection processing (S105) and observation-direction calculation processing (S106), the control system 22 performs autofocus processing (S107) for at least the perpendicular column 20a, and controls, for example, the objective lens 55 so that a focus adjustment of an electron beam to the target wafer to be observed is made. In this case, at the time of imaging at high magnification, if a position at which the target wafer to be observed is irradiated by the perpendicular column 20a coincides with a position at which the target wafer to be observed is irradiated by the tilted column 20b, it is necessary to make a focus adjustment to an intersection point between the irradiation optical axis of the perpendicular column 20a and the irradiation optical axis of the tilted column 20b (a point at which the surface of the target wafer to be observed 25 is placed). Basically, the tilted column 20b only performs imaging at high magnification. What is more, the relative positional relationship with the perpendicular column 20a is fixed. Therefore, by determining beforehand a focused position from the positional relationship with the perpendicular column 20a, the control system 22 can control, for example, the objective lens 55 with respect to the tilted column 20b as well as the perpendicular column 20a to make a focus adjustment. Incidentally, if there is no Z stage, a height position of the surface of the target wafer to be observed 25 becomes constant.

Figure 7:
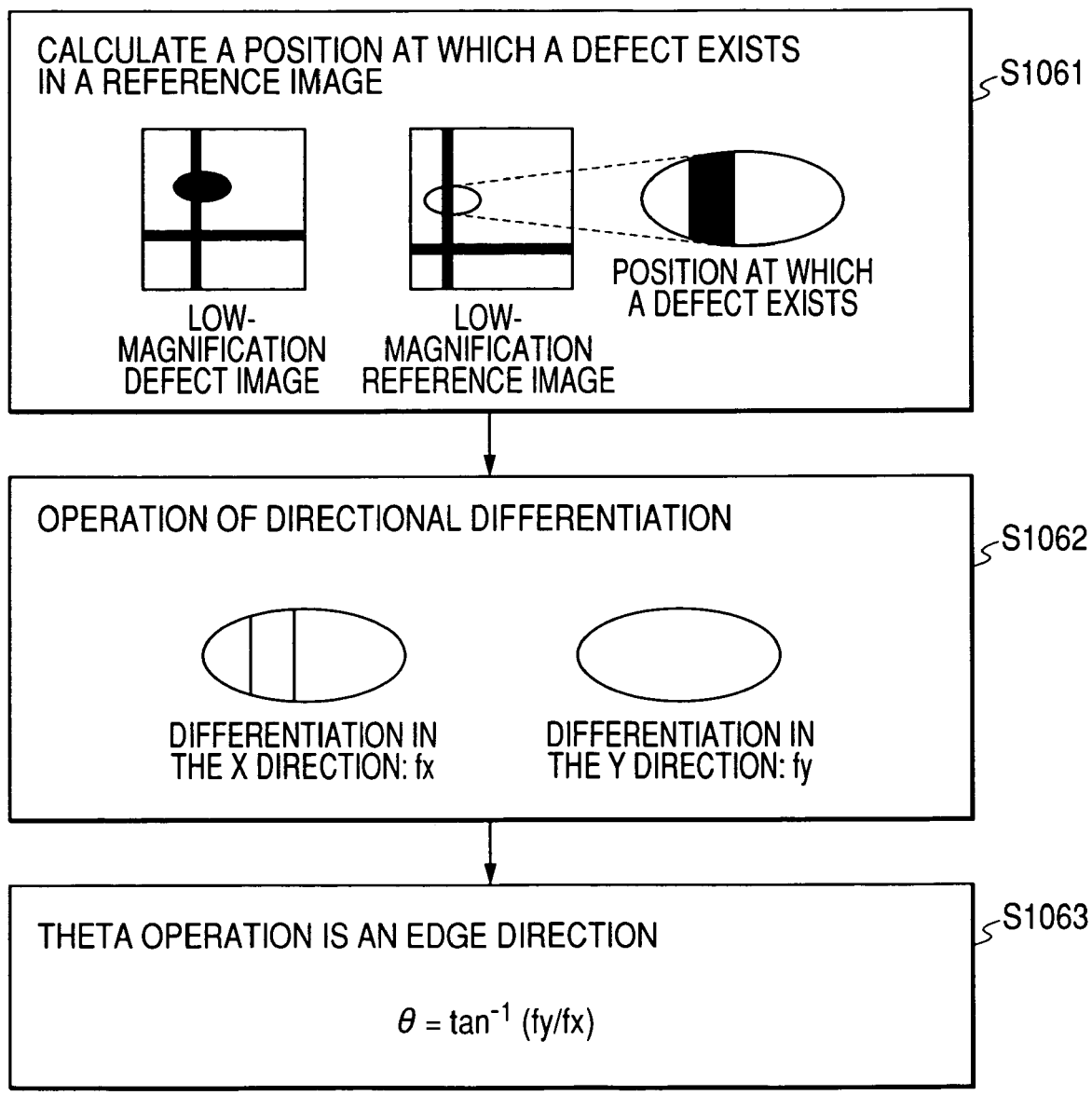
FIG. 7 is a diagram illustrating one embodiment of arithmetic operation performed in an observing method.

Next, the control system 22 controls in step S108, via the stage controller 24, the rotation of the theta stage in the observation direction determined in the observation-direction calculation processing (S106). Then, the control system 22 controls slight movement of the XY stage for displacement error components caused based on the rotation control of the theta stage to position the precise defect position that has been calculated at the step (S105), in a high-magnification visual field of the perpendicular column 20a and that of the tilted column 20b. Thus, the reason why the rotation of the theta stage is controlled in the observation direction is in particular that the shading appearing in a high-magnification review defect image taken by the tilted column 20b is aligned with the observation direction (for example, as shown in FIG. 7, a direction of a wiring pattern (circuit pattern)).

Next, the perpendicular column 20a performs beam scanning and image acquisition at the precise defect position, thereby acquires a review defect image (perpendicular observation image) at high magnification (observation magnification), and then stores the review defect image in the image memory 61 of the image processing system 21 (S109). As a result, it becomes possible to provide the control system 22 with the review defect image and store the review defect image in the storage device 28. In addition, the tilted column 20b performs beam scanning and image acquisition at the precise defect position to acquire a review defect image (tilt observation image) at high magnification (observation magnification) in like manner, and then stores the review defect image in the image memory 61 of the image processing system 21 (S110). As a result, it becomes possible to provide the control system 22 with the review defect image and store the review defect image in the storage device 28.

Next, the control system 22 makes a judgment as to whether or not there is a remaining defect candidate to be reviewed (S111). If there is a remaining defect candidate, the above processing is repeatedly executed. If all processing of defect candidates to be reviewed is completed, the ADR ends. As described above, during the ADR sequence, the perpendicular observation image and the tilt observation image can be concurrently acquired, and the acquired images can be stored, e.g., in the storage device 28.

In particular, at the time of a tilt observation made by use of the tilted column 20b, it is desirable to change an observation direction in response to a review defect. For example, when a tilt observation of an embedding failure of a wiring pattern (circuit pattern) is made, a direction which is orthogonal to the wiring pattern is suitable for the tilt observation. Thus, in order to change an observation direction according to a kind of a review defect, it is necessary to determine the observation direction.

Accordingly, how the observation-direction calculation processing (S106) is performed in response to a review defect will be described with reference to FIG. 7. This processing is performed by, for example, image correction means 62 after the defect detection processing (S105). First of all, on the basis of a difference image, showing a defect, between a low-magnification defect image and a low-magnification reference image, a position at which a defect exists in the low-magnification reference image is calculated (S1061). Next, operation of directional differentiation is performed at the calculated position at which the defect exists, and thereby differential values fx, fy in both XY directions are acquired (S1062). Next, for example, the image correction means 62 calculates an edge direction (observation direction) θ of a wiring pattern by the undermentioned equation (3) (S1063). As a result, it becomes possible to provide the control system 22 with the edge direction.

$$\theta = \tan^{-1}(fy/fx) \quad (3)$$

Figure 8A:
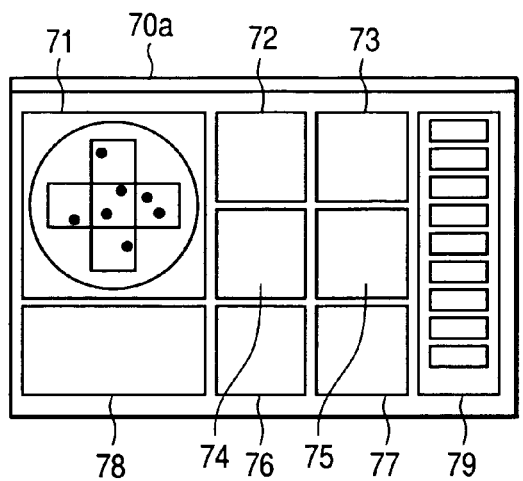
FIG. 8A is a diagram illustrating a GUI that displays at the same time a wafer map showing chip location on a wafer and six kinds of images in total.
Figure 8B:
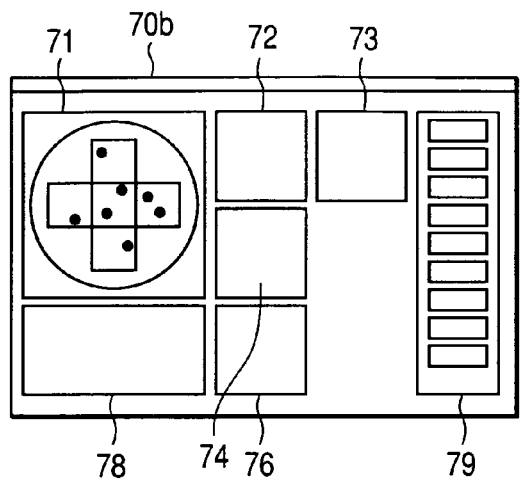
FIG. 8B is a diagram illustrating a GUI that displays at the same time the wafer map showing chip location on a wafer and four kinds of images in total.
Figure 8C:
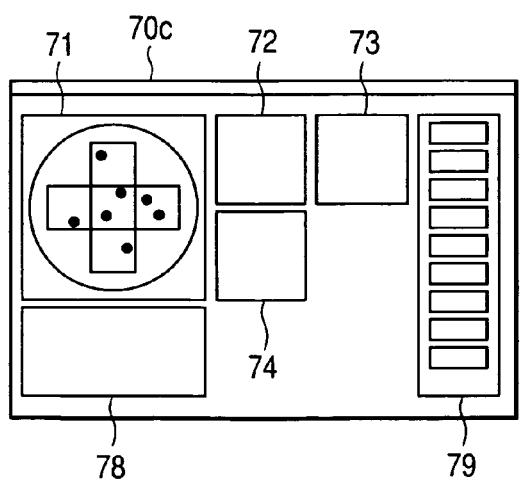
FIG. 8C is a diagram illustrating a GUI that displays at the same time the wafer map showing chip location on a wafer and three kinds of images in total.
Figure 8D:
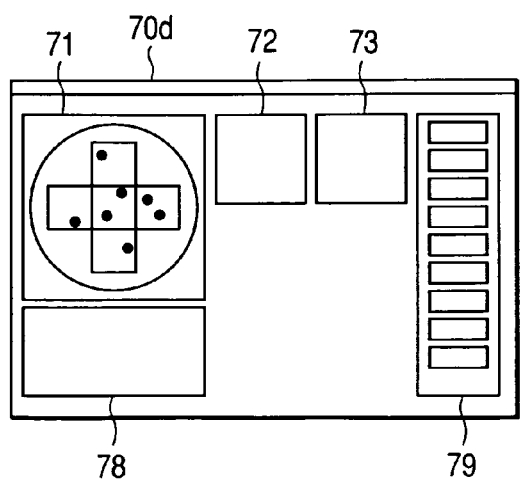
FIG. 8D is a diagram illustrating a GUI that displays at the same time the wafer map showing chip location on a wafer and two kinds of images.

Next, a first embodiment of GUI (Graphical User Interface) for displaying an acquired image with high magnification (a magnification of about 100,000) on a display 23 or 42 in the control system 22, or in the image processing system 41 to which an image is sent from the control system 22, will be described with reference to FIG. 8. FIG. 8A is a diagram illustrating a GUI that displays at the same time a wafer map 71 showing chip location on a wafer and six kinds of images in total, i.e., a perpendicular observation image (secondary electron image) 72, a perpendicular observation image (right shading image) 74, and a perpendicular observation image (left shading image) 76, which have been imaged by a perpendicular column 20a, and a tilt observation image (secondary electron image) 73, a tilt observation image (right shading image) 75, and a tilt observation image (left shading image) 77, which have been imaged by a tilted column 20b; FIG. 8B is a diagram illustrating a GUI that displays at the same time the wafer map 71 showing chip location on a wafer and four kinds of images in total, i.e., the perpendicular observation image (secondary electron image) 72, the perpendicular observation image (right shading image) 74, and the perpendicular observation image (left shading image) 76, which have been imaged by the perpendicular column 20a, and the tilt observation image (secondary electron image) 73 that has been imaged by a tilted column 20b; FIG. 8C is a diagram illustrating a GUI that displays at the same time the wafer map 71 showing chip location on a wafer and three kinds of images in total, said three kinds of images, i.e., the perpendicular observation image (secondary electron image) 72, and the perpendicular observation image (right shading image) 74, which have been imaged by the perpendicular column 20a, and the tilt observation image (secondary electron image) 73 that has been imaged by the tilted column 20b; FIG. 8D is a diagram illustrating a GUI that displays at the same time the wafer map 71 showing chip location on a wafer and two kinds of images, i.e., the perpendicular observation image (secondary electron image) 72 that has been imaged by a perpendicular column 20a, and the tilt observation image (secondary electron image) 73 that has been imaged by the tilted column 20b.

A GUI 70a shown in FIG. 8A includes a wafer map 71 illustrating chip location on a wafer. Each position at which a review defect exists is marked. When a mark is clicked, information including defect coordinates, and the defect size, of the review defect associated with the mark is displayed in a defect information display part 78. In addition to the information, it is possible to concurrently display six kinds of images corresponding to the review defect in question: a perpendicular observation image (secondary electron image) 72, a perpendicular observation image (right shading image) 74, and a perpendicular observation image (left shading image) 76, which have been imaged at high magnification by the perpendicular column 20a; and a tilt observation image (secondary electron image) 73, a tilt observation image (right shading image) 75, and a tilt observation image (left shading image) 77, which have been imaged at high magnification by the tilted column 20b. Thus, by concurrently observing the high-magnification perpendicular observation images 72, 74, 76 and the high-magnification tilt observation images 73, 75, 77, it is possible to efficiently analyze defects (defect classification) in, for example, the defect classification unit 40.

Incidentally, FIGS. 8B, 8C, 8D are diagrams that illustrate modified examples 70b, 70c, 70d of the above-mentioned GUI respectively. In the GUI, instead of displaying all of the six kinds of images, only the perpendicular observation image (secondary electron image) 72, the perpendicular observation image (right shading image) 74, the perpendicular observation image (left shading image) 76, and the tilt observation image (secondary electron image) 73, corresponding to the review defect in question, are displayed (FIG. 8B). In another case, only the perpendicular observation image (secondary electron image) 72, the tilt observation image (secondary electron image) 73, and the perpendicular observation image (right shading image) 74, corresponding to the review defect in question, are displayed (FIG. 8C). In this case, instead of the perpendicular observation image (right shading image) 74, the perpendicular observation image (left shading image) 75 may also be displayed. In still another case, only the perpendicular observation image (secondary electron image) 72 and the tilt observation image (secondary electron image) 73, corresponding to the review defect in question, are displayed (FIG. 8D).

Figure 9:
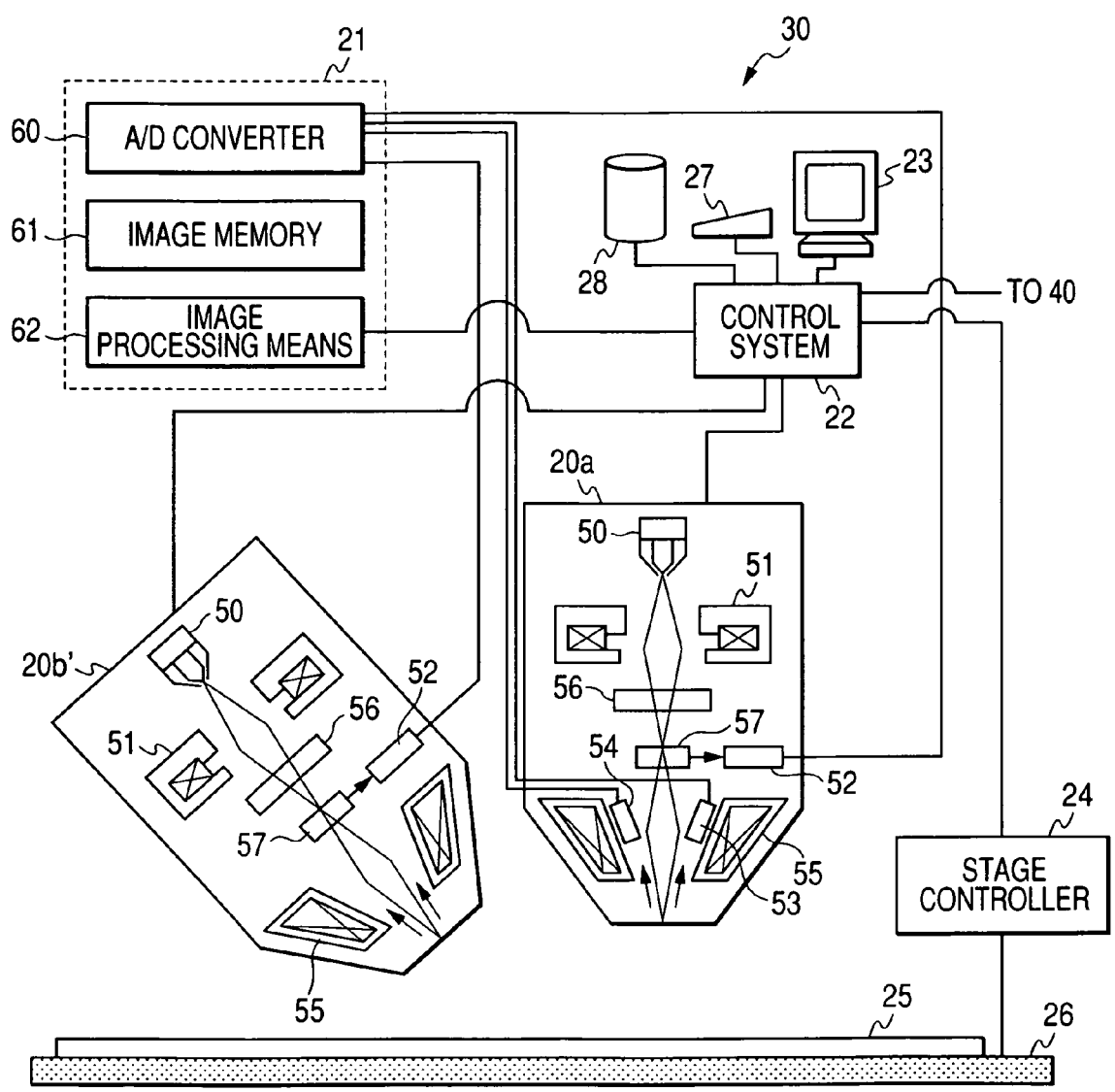
FIG. 9 is a diagram illustrating a third modified example of a configuration of an electro-optical system column.

Next, a third modified example relating to the first embodiment of the above column configuration will be described with reference to FIG. 9. In the third modified example, as shown in FIG. 9, an electro-optical system column (perpendicular column) 20a includes secondary electron detection means 52 and reflected electron detection means 53, 54. On the other hand, an electro-optical system column (tilted column) 20b' does not include reflected electron detection means. The tilted column 20b' includes only secondary electron detection means 52 for detecting a secondary electron image. Therefore, according to the third modified example, excluding the reflected electron detection means from the tilted column 20b' makes it possible to reduce the size of the tilted column. This makes it easy to adjust a beam irradiation position by the perpendicular column 20a and that by the tilted column 20b' so that the positions coincide with each other on the target wafer to be observed 25.

Figure 10:
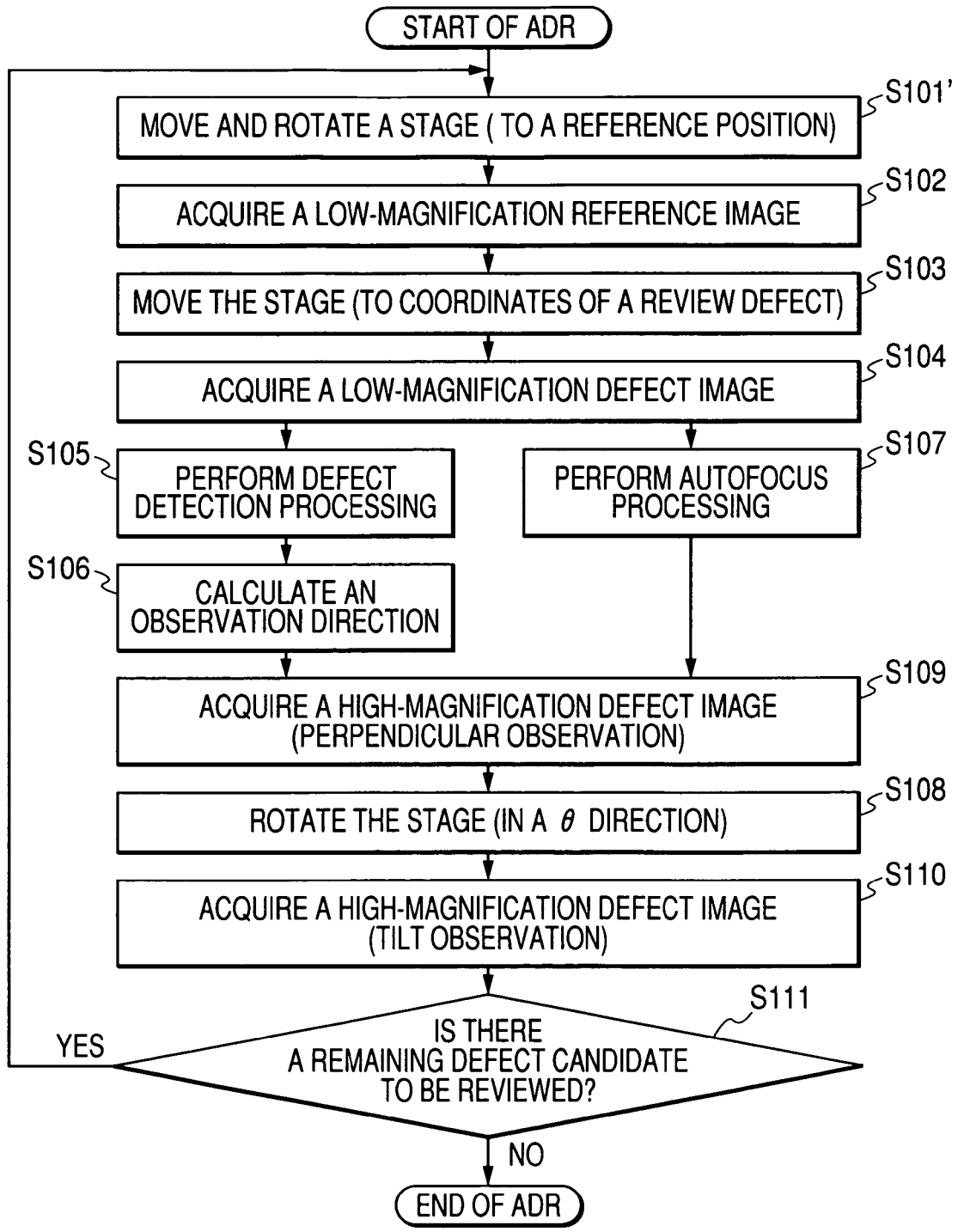
FIG. 10 is a diagram illustrating a first modified example of an automatic defect image acquisition sequence.

Next, a first modified example relating to the first embodiment of the above ADR sequence will be described with reference to FIG. 10. The first modified example is different from the first embodiment shown in FIG. 6 in the following point: A high-magnification defect image is acquired by the perpendicular column 20a in the same direction on a horizontal plane with respect to each review defect (without rotating the theta stage) (S109). Then the theta stage is properly rotated in response to each review defect (S108), and thus a high-magnification defect image is acquired by the tilted column 20b (S110). To be more specific, in the first modified example, at the time of high magnification imaging by the perpendicular column 20a (S109), the theta stage is not rotated. However, at the time of high magnification imaging by the tilted column 20b (S110), the stage is rotated in a stage rotation direction (θ direction) determined beforehand in the observation-direction calculation processing (S106) (S108). Therefore, when the stage (S101') is moved before acquisition of the low-magnification reference image of the next review defect, it is necessary to change the rotation direction of the theta stage to an initial state. Thus, according to the first modified example, the perpendicular column 20a can acquire a high-magnification defect image of particles having no directivity, defects in a hole, and the like, by the perpendicular observation. On the other hand, the tilted column 20b can acquire a high-magnification defect image of, for example, an embedding failure of a wiring pattern by the tilt observation in which shading appears from the observation direction orthogonal to a wiring pattern. As a result, it becomes possible to analyze in detail a cause of a process failure for various kinds of review defects in the defect classification unit 40.

Figure 11:
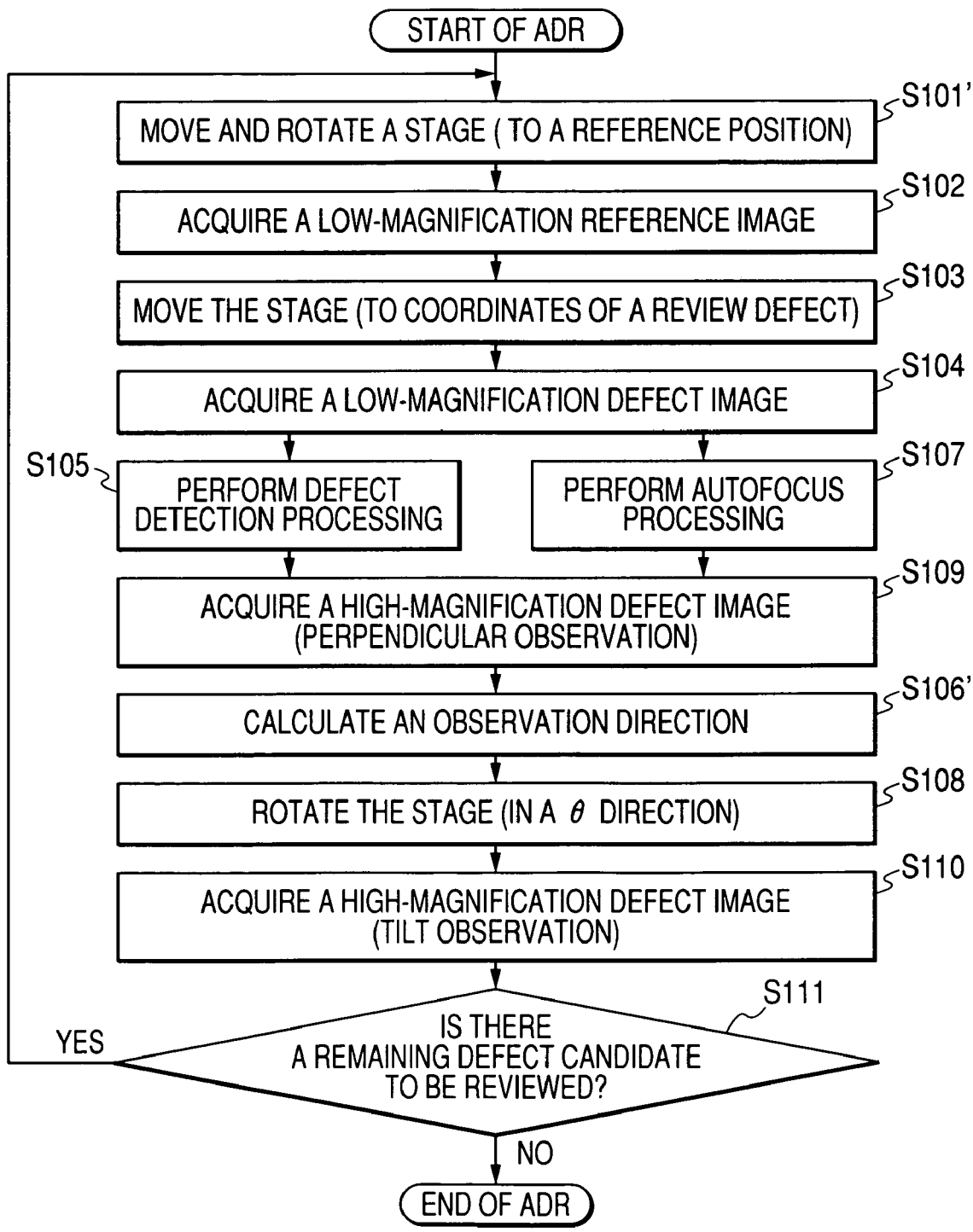
FIG. 11 is a diagram illustrating a second modified example of an automatic defect image acquisition sequence.

Next, a second modified example relating to the first embodiment of the above ADR sequence will be described with reference to FIG. 11. The second modified example is different from the first modified example shown in FIG. 10 in the following point: The operation of the observation direction (S106') is performed by use of the high-magnification defect image acquired by the perpendicular column 20a and the high-magnification reference image (acquired by moving the stage system 26 to a reference position at which it is thought to be the same pattern). This makes it possible to acquire a high-magnification defect image with shading in alignment with a direction of the wiring pattern in particular by the tilted column 20b. As a result, in the defect classification unit 40, it becomes possible to analyze in detail a cause of a process failure for an embedding failure/defect of a wiring pattern.

Figure 12:
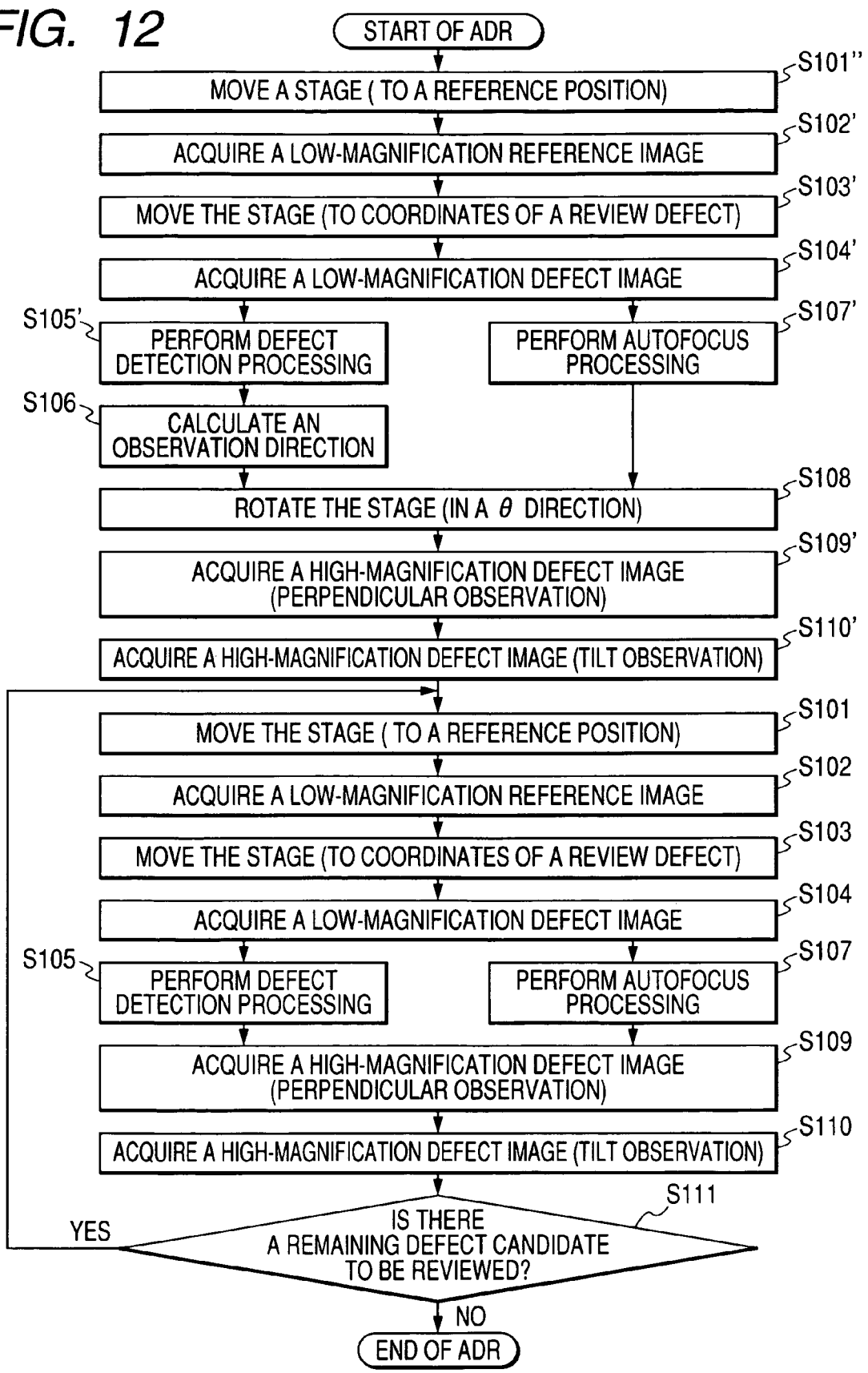
FIG. 12 is a diagram illustrating a third modified example of an automatic defect image acquisition sequence.

Next, a third modified example relating to the first embodiment of the above ADR sequence will be described with reference to FIG. 12. The third modified example is different from the first embodiment shown in FIG. 6 in the following sequence: A precise position of a first review defect is detected (S101", S102' through S105'). An observation direction is calculated by use of the precise position information of the review defect, a low-magnification defect image, and a low-magnification reference image (S106). A theta stage is rotated on the basis of the observation direction (S108), imaging is performed without rotating the theta stage thereafter (S109', S110', S101 through S111). Incidentally, steps S101", S102' through S105', and S107' correspond to steps S101, S102 through S105, and S107 shown in FIG. 6 respectively, for handling the first review defect. For example, because a pattern of the target wafer to be observed 25 is uniform in a memory cell part of a semiconductor, it is not necessary to perform the calculation of an observation direction and the rotation of the stage on a review defect basis. Thus, determining the observation direction at the time of the first review defect makes it possible to perform the calculation at higher speed as compared with a case where the image processing means 62 performs the calculation on a review defect basis. What is more, it becomes possible to acquire a high-magnification defect image with shading in alignment with to a direction of the wiring pattern in particular by the tilted column 20b. This enables the defect classification unit 40 to analyze in detail a cause of a process failure relating to an embedding failure/defect of a wiring pattern.

Figure 13:
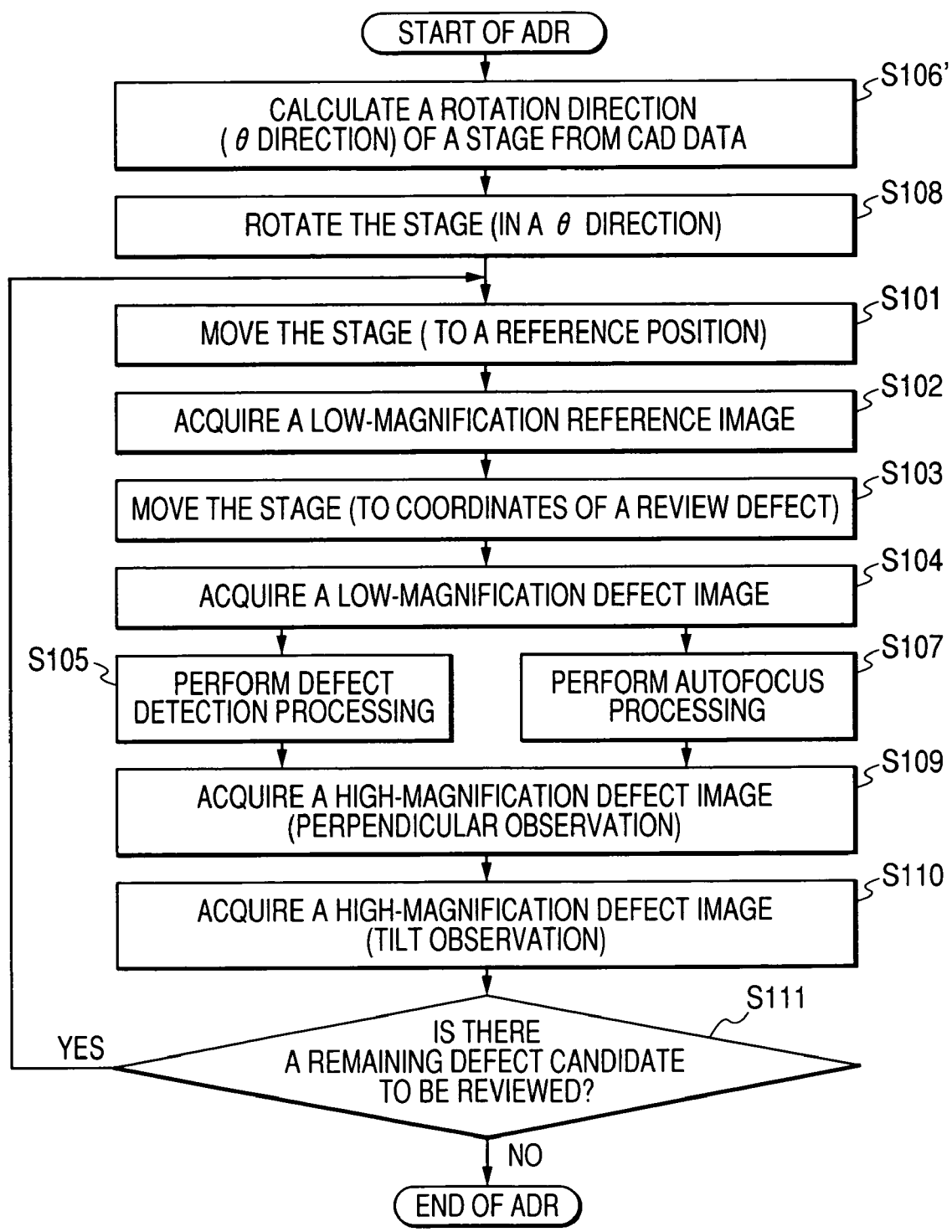
FIG. 13 is a diagram illustrating a fourth modified example of an automatic defect image acquisition sequence.

Next, a fourth modified example relating to the first embodiment of the above ADR sequence will be described with reference to FIG. 13. The fourth modified example is similar to the third modified example shown in FIG. 12. To be more specific, the fourth modified example provides a sequence including the steps of: for example, on the basis of CAD data that is inputted from a CAD system (not illustrated) and is stored in the storage device 28, calculating an observation direction (rotation direction of a theta stage) (S106') by the control system 22 and rotating the theta stage (S108); and after that, performing imaging without rotating the stage (S101 through S105, S107, and S109 through S111). Thus, according to the fourth modified example, the same effects as those of the third modified example can be produced.

Second Embodiment

As is the case with the first embodiment, a second embodiment of the present invention relates to a review SEM apparatus for acquiring (reviewing) a review image of a defective part detected by a visual inspection apparatus. The second embodiment is characterized by high-speed acquisition of a tilt observation image as well as an incident-light image at the time of reviewing.

Figure 14:
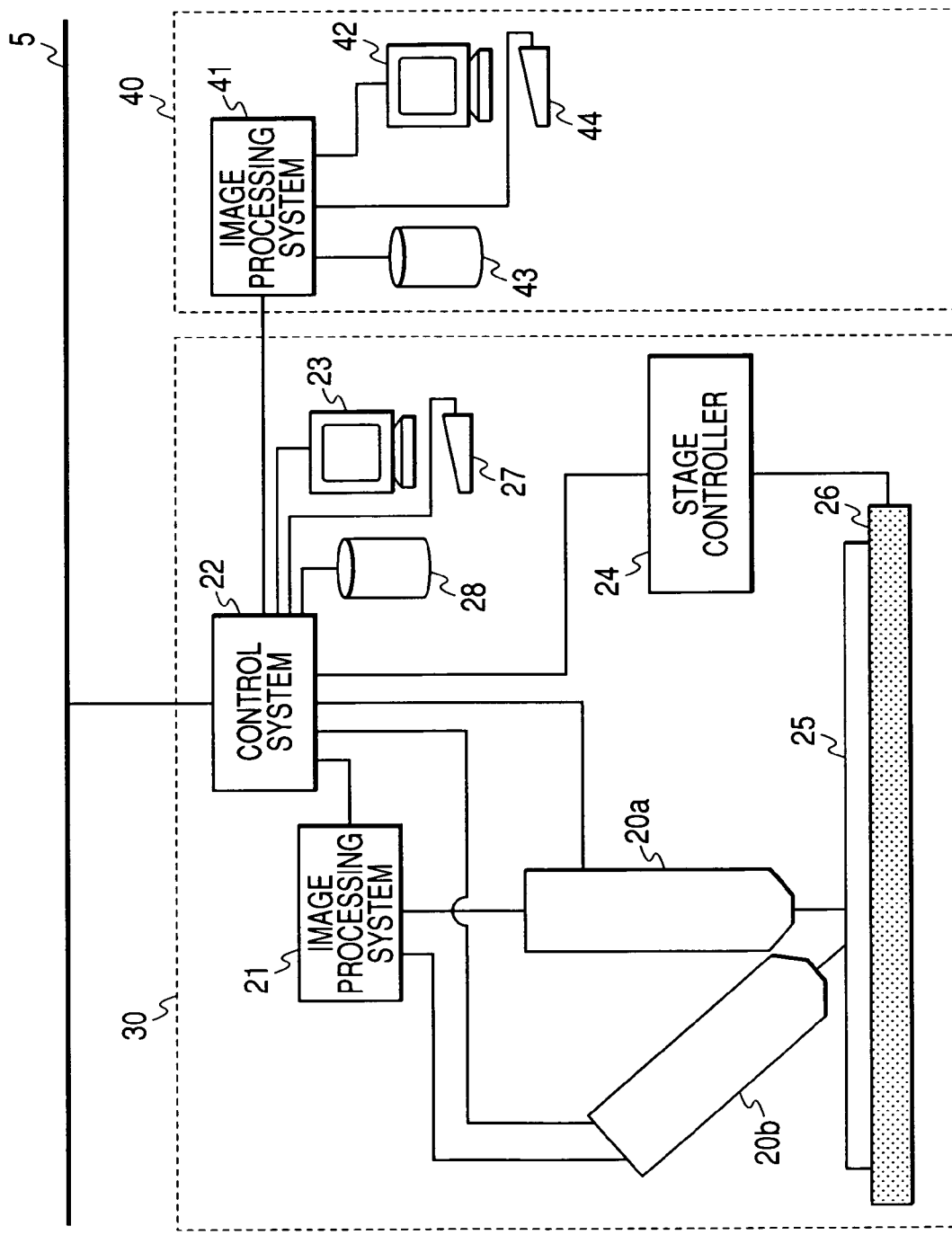
FIG. 14 is a diagram illustrating the configuration of a review SEM apparatus according to a second embodiment.

Next, a configuration of a review SEM apparatus according to the second embodiment of the present invention will be described with reference to FIG. 14. The column size becomes larger depending on the design of an electro-optical system column in some cases. Therefore, a point of difference between the configuration of the review SEM apparatus 1 according to the second embodiment and the configuration of the apparatus according to the first embodiment shown in FIGS. 2 and 3 is that a position irradiated with a beam by the electro-optical system column (perpendicular column) 20a is not the same as a position irradiated with a beam by the electro-optical system column (tilted column) 20b. In other words, both of the positions, each of which is irradiated with the beam, deviate from each other.

Figure 15:
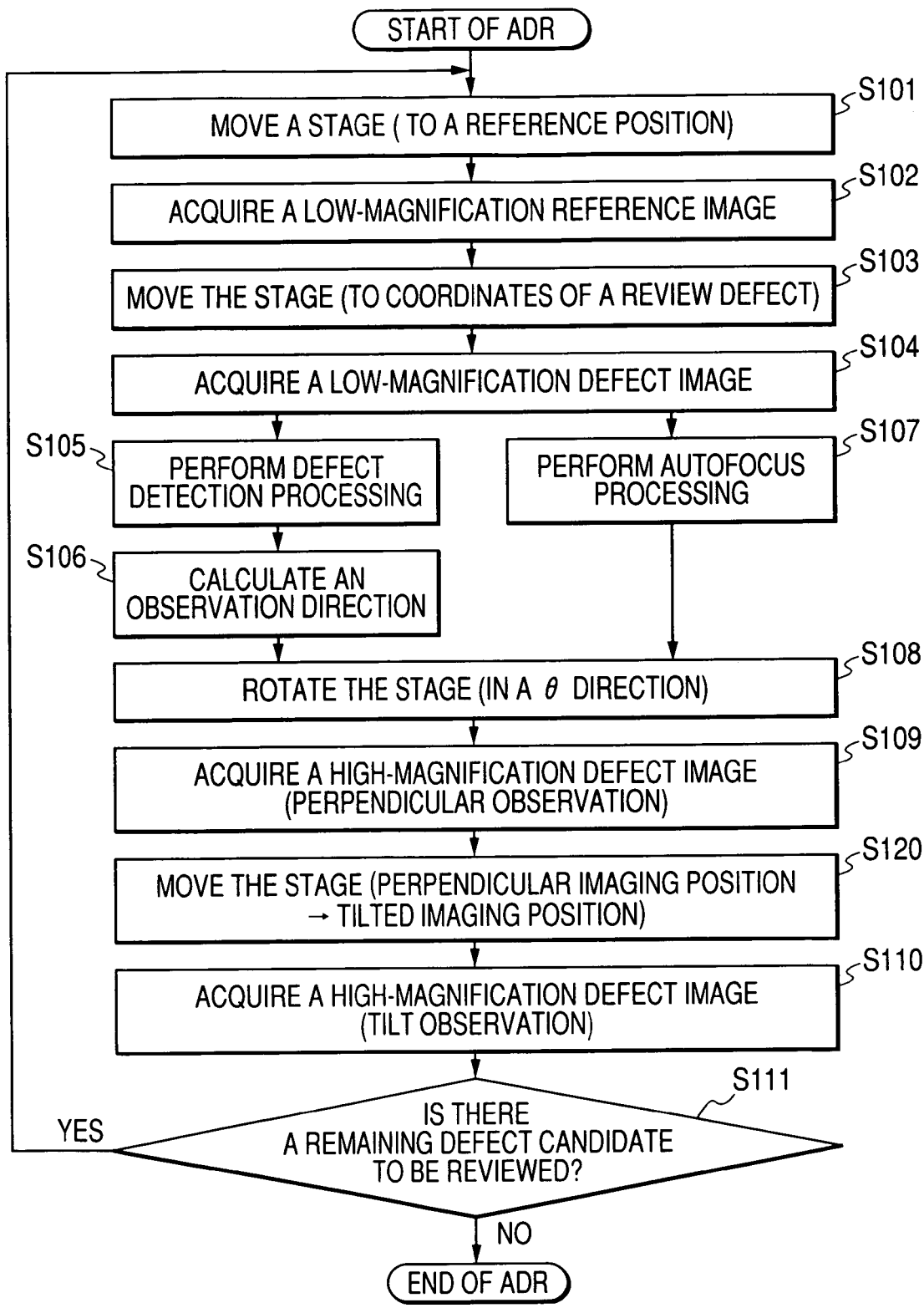
FIG. 15 is a diagram illustrating an automatic defect image acquisition sequence according to the second embodiment.

Next, a second embodiment of an automatic defect image acquisition (ADR) sequence, which uses the review SEM apparatus according to the second embodiment, will be described with reference to FIG. 15. More specifically, this sequence according to the second embodiment relates to processing including the steps of: carrying (loading) the target wafer to be observed 25 into the apparatus; after setting conditions of an electro-optical system, inspecting it by the visual inspection apparatus 2; and on the basis of the result of inspection (defect position information) stored in the inspection-result server 3, and review defect candidates sampled by the review sampling computer 4, automatically acquiring an image of a review defective part. The sequence according to the second embodiment is similar to that according to the first embodiment shown in FIG. 6. A point of difference between the first and second embodiments is a sequence including the steps of: because the beam irradiation positions differ from each other, acquiring a high-magnification review defect image of a review defect at a perpendicular imaging position by the perpendicular column 20a (S109); after that, moving a stage to a tilt-imaging position by the tilted column 20b on the basis of an offset value that is determined as described later (S120), and acquiring a high-magnification review defect image (S110). In addition, at the time of imaging at high magnification, a position at which the target wafer to be observed is irradiated by the perpendicular column 20a is made to deviate from a position at which the target wafer to be observed is irradiated by the tilted column 20b. For that purpose, in an autofocus adjustment step (S107), for example, the objective lens 55 in each of the perpendicular column 20a and the tilted column 20b should be controlled at a height position (Z directional position) of a surface of the target wafer to be observed 25, at which the amount of deviation (offset value) is calculated, thus making a focus adjustment. Incidentally, if there is no Z stage, a height position of the surface of the target wafer to be observed 25 becomes constant.

Figure 16:
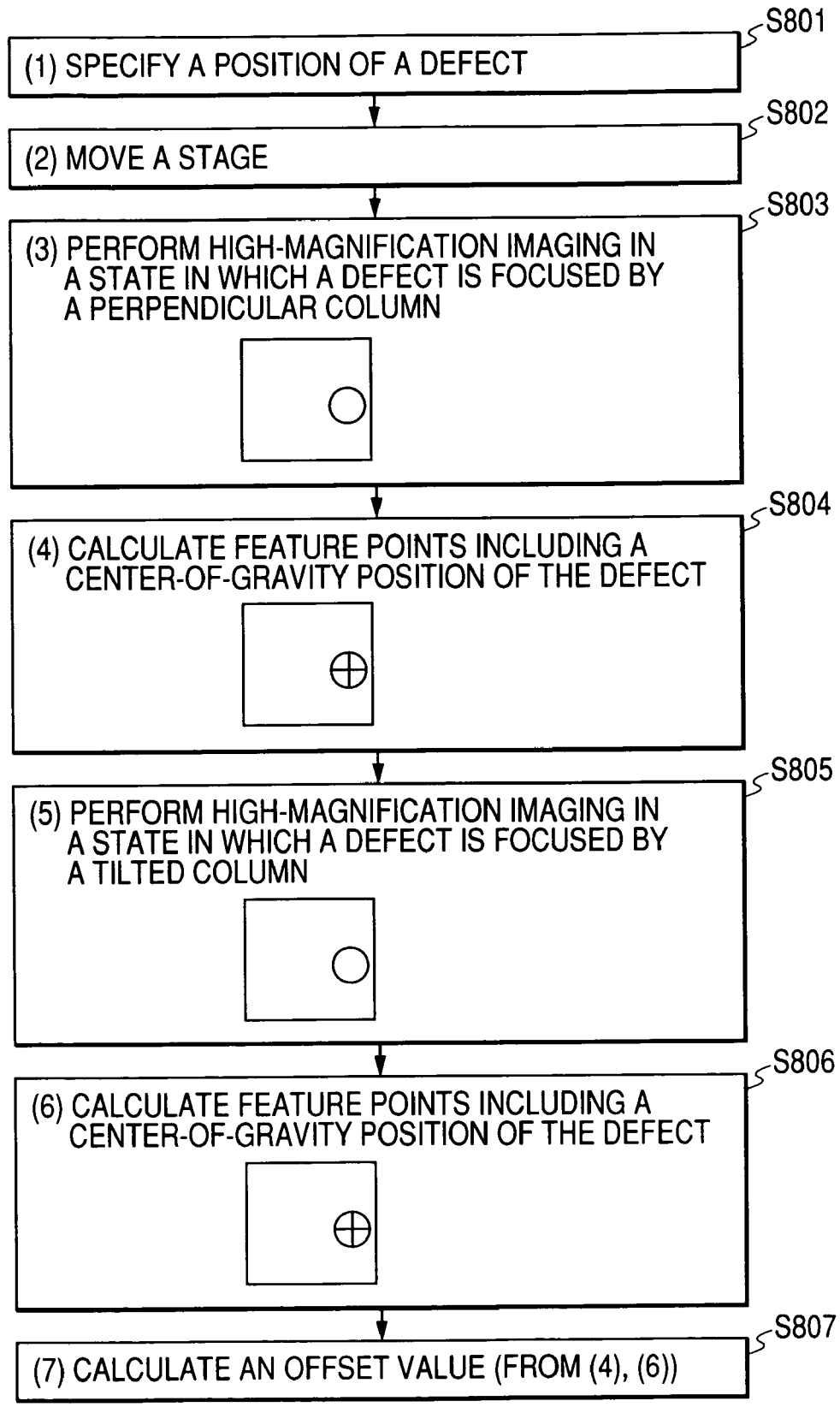
FIG. 16 is a diagram illustrating a calculation method for calculating an offset value in the second embodiment.

Next, a calculation method for calculating the offset value will be described with reference to FIG. 16. In a wafer map on a GUI screen, the control system 22 specifies, for example, a position of a certain review defect (more specifically, a position of a certain review defect detected in the step S105 on the basis of the result of comparison between a low-magnification defect image imaged by the perpendicular column 20a and a low-magnification reference image) (S801). Then, the control system 22 controls and moves a stage to the specified position of the certain review defect so that the certain review defect is positioned into a high-magnification visual field of the perpendicular column 20a (S802). Next, the perpendicular column 20a images the certain review defect at high magnification with the certain review defect subjected to a focus adjustment (S803). The image processing means 62 calculates a first feature point including a center-of-gravity position of the certain review defect on the basis of the high-magnification incident-light image, and then stores the first feature point in the storage device 28 (S804). The approximate amount of deviation between a beam irradiation position of a beam emitted by the perpendicular column 20a and a beam irradiation position of a beam emitted by the tilted column 20b is measured beforehand, and the measured amount of deviation is stored in the storage device 28. Next, the control system 22 controls the stage to move by the approximate amount of deviation that is a known shift value, thereby positioning the certain review defect into a high-magnification visual field of the tilted column 20b. Next, the tilted column 20b images the certain review defect at high magnification with the certain review defect subjected to a focus adjustment (S805). The image processing means 62 calculates a second feature point including a center-of-gravity position of the certain review defect on the basis of the high-magnification tilt observation image, and then stores the second feature point in the storage device 28 (S806). Next, on the basis of the known shift value and the amount of deviation between the first and second feature points, which are stored in the storage device 28, the control system 22 calculates an offset value at the time of imaging at high magnification, and then stores the offset value in the storage device 28 (S807).

As a result of the processing described above, an offset value between a high-magnification review defect image which is acquired with a focus adjustment being made by the perpendicular column 20a and a high-magnification review defect image which is acquired with a focus adjustment being made by the tilted column 20b is determined.

Incidentally, the offset value may also be calculated every time the target wafer to be observed 25 is carried into the review SEM apparatus 1, or the offset value may also be calculated on a review defect basis.

As described above, according to the embodiment, it is possible to acquire at high speed a tilt observation image concurrently with a perpendicular observation image during ADR. As a result, it becomes possible to efficiently analyze defects.

In addition, according to the embodiment, it becomes possible to analyze in detail a cause of a process failure earlier by use of a perpendicular observation image and a tilt observation image. This makes it possible to contribute to an improvement in yield.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. An electron-beam observation apparatus comprising:
   a stage on which a to-be-observed target sample having a defect is placed, the defect being detected by an inspection apparatus beforehand, the stage movable in XY directions and rotatable in a horizontal plane;
   a first electro-optical system which irradiates by scanning a converged electron beam from a substantially perpendicular direction to the defect on the target sample to be observed, and outputs a defect image signal with perpendicular observation by detecting at least one of a secondary electron image and a reflected electron image which is generated from the defect by first electron detection means;
   a second electro-optical system which irradiates by scanning a converged electron beam from a tilted direction to the defect on the target sample to be observed, and outputs a defect image signal with tilt observation by detecting at least one of a secondary electron image and a reflected electron image which is generated from the defect on the target sample to be observed by second electron detection means;
   a defect image signal acquisition unit which acquires the defect image signal with the perpendicular observation from the first electro-optical system, and the defect image signal with the tilt observation from the second electro-optical system; and
   a control unit which controls position of said stage in X and Y directions when said stage is rotating in a horizontal plane to keep the detect in a vicinity field of said trust electro-optical system and said second electro-optical system.

2. The electron-beam observation apparatus according to claim 1, wherein:
said first electron detection means mainly includes secondary electron detection means which catches secondary electron, and reflected electron detection means which catches reflected electron; and
said defect image signal with the perpendicular observation acquired by the first electro-optical system includes a secondary electron image and a shading image being a reflected electron image.

3. The electron-beam observation apparatus according to claim 1, wherein:
said second electron detection means mainly includes secondary electron detection means which catches a secondary electron, and reflected electron detection means which catches a reflected electron; and
said defect image signal with the tilt observation acquired by the second electro-optical system includes a secondary electron image and a shading image being a reflected electron image.

4. The electron-beam observation apparatus according to claim 1, wherein:
said first electro-optical system or said second electro-optical system has a beam tilt function.

5. The electron-beam observation apparatus according to claim 1, further comprising:
a display unit which displays a defect image signal with the perpendicular observation which has been acquired by the first electro-optical system, and a defect image signal with the tilt observation which has been acquired by the second electro-optical system.

6. The electron-beam observation apparatus according to claim 1, wherein:
said first electro-optical system is configured to detect a low-magnification reference image signal and a low-magnification defect image signal by the first electron detection means; and
further comprising an image processing means which detects a precise defect position by comparing between the low-magnification defect image signal and the low-magnification reference image signal that have been detected;
wherein the defect image signal is acquired with the perpendicular observation at high magnification by the first electro-optical system by positioning said precise defect position detected by the image processing means in an imaging visual field of the first electro-optical system;
wherein the defect image signal is acquired with the tilt observation at high magnification by the second electro-optical system by positioning said precise defect position detected by the image processing means in an imaging visual field of the second electro-optical system.

7. An electron-beam observation apparatus comprising:
a stage on which a to-be-observed target sample having a defect is placed, said defect being detected by an inspection apparatus beforehand, said stage movable in XY directions and rotatable in a horizontal plane;
a first electro-optical system which irradiates by scanning a converged electron beam from a substantially perpendicular direction to the defect on the target sample to be observed, and outputs a defect image signal with perpendicular observation at high magnification by detecting by first electron detection means at least one of a secondary electron image and a reflected electron image which is generated from the defect on the target sample to be observed;
a second electro-optical system which irradiates by scanning a converged electron beam from a tilted direction to the defect on the target sample to be observed, and outputs a defect image signal with tilt observation at high magnification by detecting by second electron detection means at least one of a secondary electron image and a reflected electron image which is generated from the defect on the target sample to be observed;
a defect image acquisition unit which acquires the defect image signal with the perpendicular observation at high magnification from the first electro-optical system, and acquires the defect image signal with the tilt observation at high magnification from the second electro-optical system;
a defect classification unit which classifies a kind of the defect on the basis of the defect image signal with the perpendicular observation at the high magnification and the defect image signal with the tilt observation at the high magnification, which have been acquired by the defect image acquisition unit; and
a control unit which controls position of said stage in X and Y directions when said stage is rotating in a horizontal plane to keen the detect in a vicinity field of said trust electro-optical system and said second electro-optical system.

8. The electron-beam observation apparatus according to claim 7, wherein:
in said defect image acquisition unit,
said first electro-optical system is configured to detect a low-magnification reference image signal and a low-magnification defect image signal by the first electron detection means; and
further comprises an image processing means which detects a precise defect position by comparing between the low-magnification defect image signal and the low-magnification reference image signal that have been detected by the first electron detection means;
wherein the defect image signal is acquired with the perpendicular observation at the high magnification by the first electro-optical system by positioning said precise defect position detected by the image processing means in an imaging visual field of the first electro-optical system;
wherein the defect image signal is acquired with the tilt observation at the high magnification by the second electro-optical system by positioning said precise defect position detected by the image processing means in an imaging visual field of the second electro-optical system.

9. An observing method using an electron-beam observation apparatus, the observing method comprising the steps of:
irradiating by scanning a converged electron beam from a substantially perpendicular direction to a defect on a target sample to be observed placed on a stage, the defect being detected by an inspection apparatus beforehand;
detecting a secondary electron and/or a reflected electron which is generated from the defect on the target sample to be observed by irradiating the converged electron beam from the substantially perpendicular direction, by a first electron detection means;
acquiring a defect image signal with perpendicular observation, from a signal detected the secondary electron and/or the reflected electron by the first electron detection means;

irradiating by scanning a converged electron beam from a tilt direction to the defect on the target sample to be observed, the defect being detected by the inspection apparatus beforehand;

detecting a secondary electron and/or a reflected electron which is generated from the defect on the target sample to be observed by irradiating the converged electron beam from the tilt direction, by a second electron detection means;

acquiring a defect image signal with tilt observation, from a signal detected the secondary electron and/or the reflected electron by the second electron detection means; and displaying the defect image signal with the perpendicular observation and the defect image signal with the tilt observation on same screen;

wherein in the step of irradiating by scanning said converged electron beam from said substantially perpendicular direction, positions of said stage in X and Y directions are controlled to keep the detect in a viewing field of said perpendicular observation, and wherein in the step of irradiating by scanning said converged electron beam from said tilt direction, positions of said stage in X and Y directions are controlled to keep the defect in a viewing field of said tilt observation.

10. The observing method using the electron-beam observation apparatus according to claim 9, wherein:

said defect image signal with the tilt observation is a beam tilt image that is acquired by scanning and irradiating the converged electron beam tilted to the defect.

11. The observing method using the electron-beam observation apparatus according to claim 9, wherein:

the defect image signal with the perpendicular observation and the defect image signal with the tilt observation are displayed on a screen on which a sample map is displayed.

12. An observing method using an electron-beam observation apparatus, said observing method comprising the steps of:

acquiring a defect image of first magnification with perpendicular observation by scanning and irradiating a converged electron beam from a substantially perpendicular direction to a first area including a defect on a target sample to be observed, the defect being detected by an inspection apparatus beforehand, and by detecting a secondary electron and/or a reflected electron which is generated from the first area;

acquiring a defect image of second magnification being higher than the first magnification with the perpendicular observation by scanning and irradiating the converged electron beam from the substantially perpendicular direction to a second area including the defect, the second area being narrower than the first area, and by detecting a secondary electron and/or a reflected electron which is generated from the second area;

acquiring a defect image of third magnification with tilt observation by scanning and irradiating a converged electron beam from tilt direction to a third area including the defect, and by detecting a secondary electron and/or a reflected electron which is generated from the third area; and displaying the defect image signal of the second magnification with the perpendicular observation and the defect image signal of the third magnification with the tilt observation, on same screen.

13. The observing method using the electron-beam observation apparatus according to claim 12, wherein:

said second magnification is the same as the third magnification.

14. The observing method using the electron-beam observation apparatus according to claim 12, wherein:

said defect image signal with the tilt observation is a beam tilt image that is acquired by scanning and irradiating the converged electron beam tilted to the defect.

15. The observing method using the electron-beam observation apparatus according to claim 12, wherein:

displaying the defect image signal with the perpendicular observation and the defect image signal with the tilt observation on a screen on which a wafer map is displayed.

* * * * *

UNITED STATES PATENT AND TRADEMARK OFFICE
CERTIFICATE OF CORRECTION

| | | |
|---|---|---|
| PATENT NO. | : 7,598,491 B2 | Page 1 of 1 |
| APPLICATION NO. | : 11/415286 | |
| DATED | : October 6, 2009 | |
| INVENTOR(S) | : Fukunishi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 523 days.

Signed and Sealed this

Twenty-eighth Day of September, 2010

David J. Kappos
*Director of the United States Patent and Trademark Office*